(12) United States Patent
Na

(10) Patent No.: US 11,133,068 B2
(45) Date of Patent: Sep. 28, 2021

(54) MEMORY DEVICE, MEMORY CONTROLLER, MEMORY SYSTEM AND METHOD FOR OPERATING MEMORY SYSTEM

(71) Applicant: SK hynix Inc., Icheon (KR)

(72) Inventor: Chung Un Na, Yongin (KR)

(73) Assignee: SK hynix Inc, Icheon (KR)

( * ) Notice: Subject to any disclaimer, the term of this patent is extended or adjusted under 35 U.S.C. 154(b) by 0 days.

(21) Appl. No.: 16/878,371

(22) Filed: May 19, 2020

(65) Prior Publication Data

US 2021/0142855 A1 May 13, 2021

(30) Foreign Application Priority Data

Nov. 12, 2019 (KR) .................. 10-2019-0144023

(51) Int. Cl.
  *G06F 12/0882* (2016.01)
  *G11C 16/26* (2006.01)
  *G11C 7/10* (2006.01)
  *G11C 16/14* (2006.01)
  *G06F 9/4401* (2018.01)
  *G06F 11/30* (2006.01)

(52) U.S. Cl.
  CPC ............ *G11C 16/14* (2013.01); *G06F 9/4418* (2013.01); *G06F 11/3037* (2013.01); *G06F 12/0882* (2013.01); *G11C 7/1054* (2013.01); *G11C 7/1084* (2013.01); *G11C 16/26* (2013.01); *G11C 2216/20* (2013.01)

(58) Field of Classification Search
  CPC ..... G11C 16/14; G11C 7/1054; G11C 7/1084; G11C 16/26; G06F 9/4418; G06F 11/3037; G06F 12/0882

USPC ..................................................... 365/185.29
See application file for complete search history.

(56) References Cited

U.S. PATENT DOCUMENTS

| | | | | |
|---|---|---|---|---|
| 5,954,828 A | * | 9/1999 | Lin ........................ | G11C 29/88 714/723 |
| 10,453,524 B2 | * | 10/2019 | Kaminaga .............. | G11C 29/46 |
| 2011/0072200 A1 | * | 3/2011 | Lee ....................... | G11C 7/1006 711/103 |
| 2011/0072201 A1 | * | 3/2011 | Lee .................... | G11C 16/0408 711/103 |

FOREIGN PATENT DOCUMENTS

| | | |
|---|---|---|
| KR | 20000033771 A | 6/2000 |
| KR | 20120092561 A | 8/2012 |
| KR | 20150017599 A | 2/2015 |
| WO | WO2011031398 A2 | 3/2011 |

* cited by examiner

*Primary Examiner* — Ly D Pham

(57) ABSTRACT

A memory system includes: a memory device including a memory cell array and a page buffer circuit, the memory device performing a data program operation or a data erase operation, suspending the data program operation or the data erase operation in response to a suspend command, performing a data read operation of storing read data from the memory cell array in the page buffer circuit in response to a read command, and performing a data output operation of outputting the read data stored in the page buffer circuit; and a memory controller outputting a pre-resume command to the memory device between a first time at which the data read operation is complete and a second time at which the data output operation starts.

20 Claims, 18 Drawing Sheets

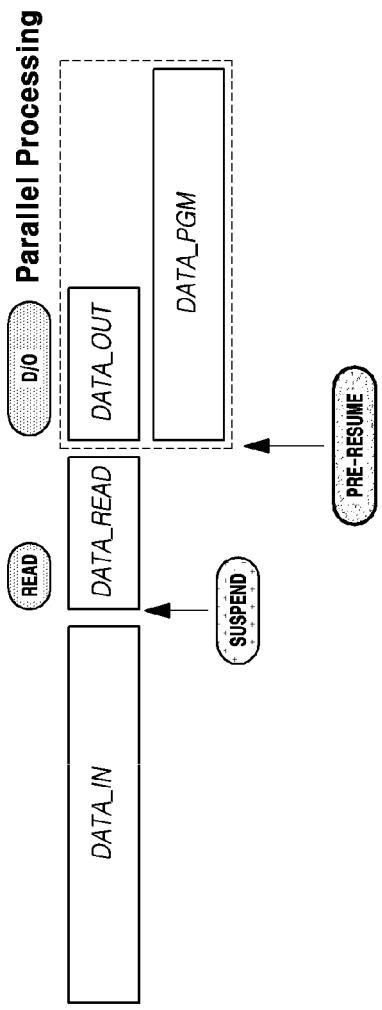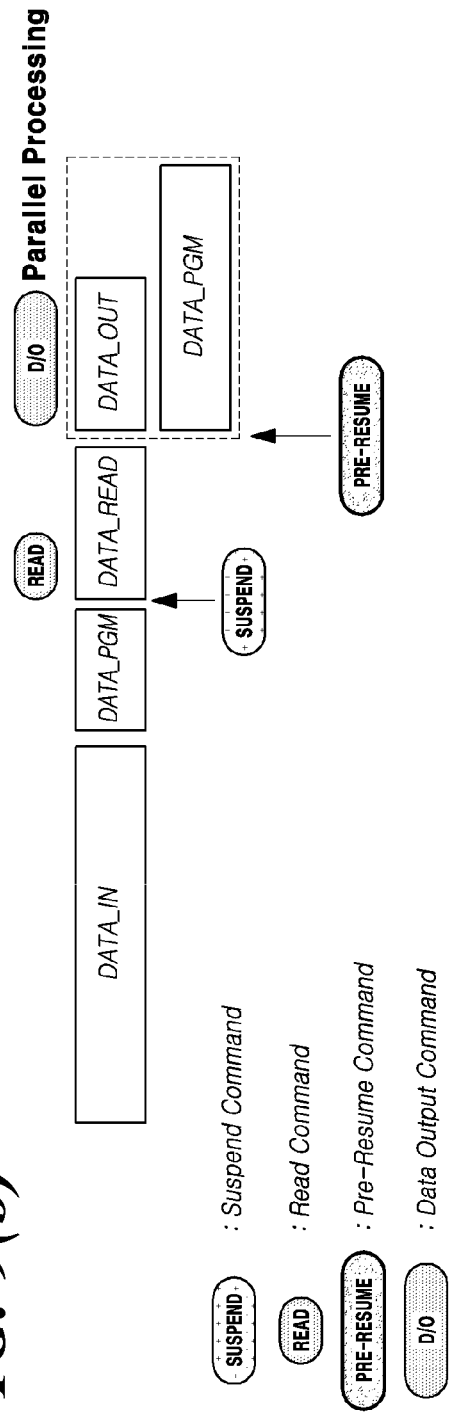
FIG. 9(a)
FIG. 9(b)

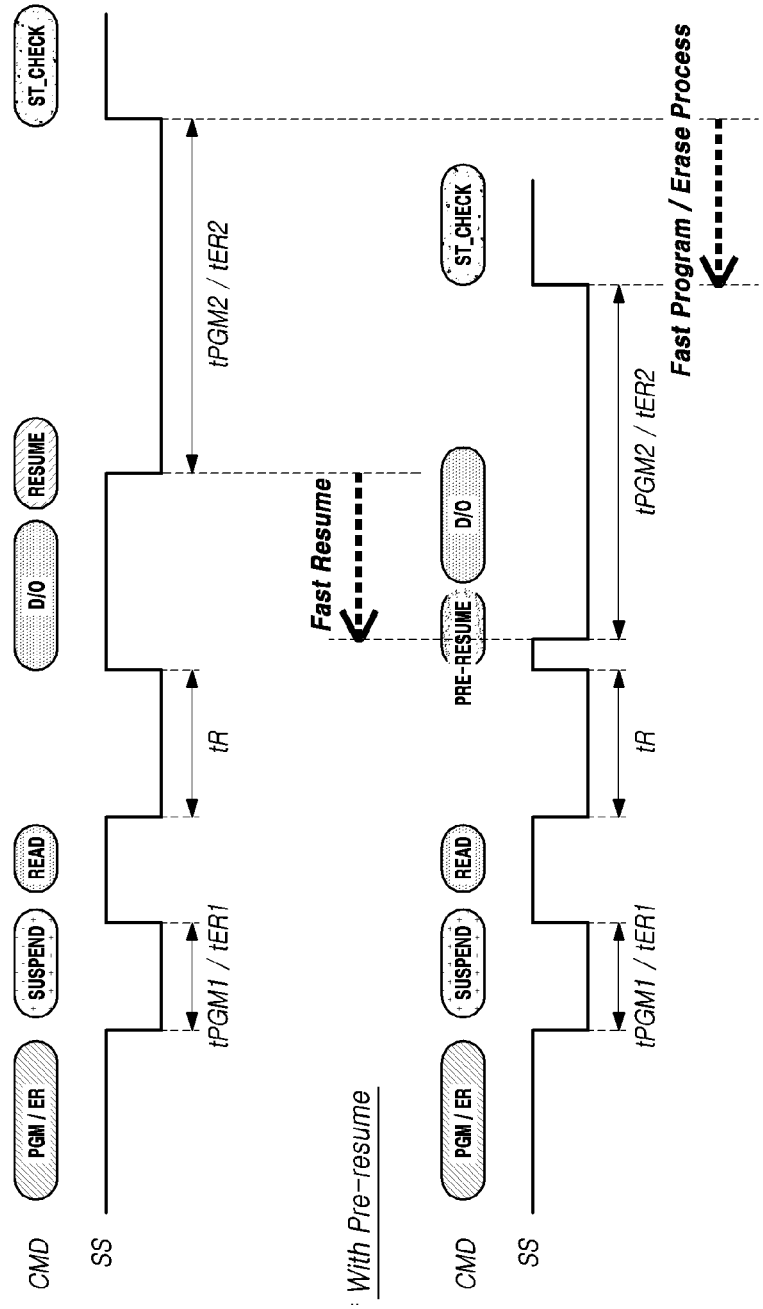
FIG. 15(a) : Without Pre-resume
FIG. 15(b) : With Pre-resume

MEMORY DEVICE, MEMORY CONTROLLER, MEMORY SYSTEM AND METHOD FOR OPERATING MEMORY SYSTEM

CROSS-REFERENCE TO RELATED APPLICATION

The present application claims priority under 35 U.S.C. 119(a) to Korean Patent Application No. 10-2019-0144023 filed in the Korean Intellectual Property Office on Nov. 12, 2019, which is incorporated herein by reference in its entirety.

BACKGROUND

1. Technical Field

Various embodiments generally relate to a memory device, a memory controller, a memory system, and a method for operating the memory system.

2. Related Art

A memory system corresponding to a storage device is a device which stores data based on a request of a host, such as a computer, a mobile terminal such as a smartphone and a tablet, or various electronic devices. The memory system may include not only a device which stores data in a magnetic disk, such as a hard disk drive (HDD), but also a device which stores data in a nonvolatile memory, such as a solid state drive (SDD), a universal flash storage (UFS) device, and an embedded MMC (eMMC) device.

The nonvolatile memory included in the memory system may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM).

The memory system may further include a memory controller for controlling a memory device. The memory controller may receive a request from the host, and may perform or control an operation for reading, programming, or erasing data in a volatile memory device or a nonvolatile memory device included in the memory system, based on the received request.

In order to increase overall quality satisfaction on the memory device, it is desirable that the quality of any one operation among read, program, and erase operations in the memory device is not significantly degraded in comparison with the other operations.

SUMMARY

Various embodiments are directed to a memory device, a memory controller, a memory system, and a method for operating the memory system capable of improving read quality, program quality, and erase quality in a balanced manner.

Also, various embodiments are directed to a memory device, a memory controller, a memory system and a method for operating the memory system capable of preferentially improving read quality and preventing program quality or erase quality from being degraded due to the improvement in read quality.

Further, various embodiments are directed to a memory device, a memory controller, a memory system and a method for operating the memory system capable of fast operation processing by simultaneously processing, in parallel, different kinds of operations that cannot be simultaneously processed in the conventional art.

In one aspect, embodiments of the disclosure may provide a memory system including: a memory device including a memory cell array and a page buffer circuit, the memory device configured to perform a data program operation or a data erase operation, suspend the data program operation or the data erase operation in response to a suspend command, perform a data read operation of storing read data from the memory cell array in the page buffer circuit in response to a read command and perform a data output operation of outputting the read data stored in the page buffer circuit; and a memory controller configured to output a pre-resume command to the memory device between a first time at which the data read operation is complete and a second time at which the data output operation starts.

In response to the pre-resume command, the memory device may resume the suspended data program operation or the suspended data erase operation, and may perform the data output operation in parallel with the resumed data program operation or the resumed data erase operation.

The memory controller may determine whether the memory device is in a state that satisfies a pre-resume condition between the first time and the second time.

The memory controller may output the pre-resume command to the memory device when the pre-resume condition is satisfied.

The memory controller may output a data output command to the memory device without outputting the pre-resume command when the pre-resume condition is not satisfied.

When the memory controller outputs the data output command to the memory device without outputting the pre-resume command, the memory controller may output a resume command to the memory device, after receiving the read data from the memory device in response to the data output command and the memory device may resume the suspended data program operation or the suspended data erase operation in response to the resume command.

In another aspect, embodiments of the disclosure may provide a method for operating a memory system including: performing a data program operation or a data erase operation; suspending the data program operation or the data erase operation in response to a suspend command; performing a data read operation of reading read data from the memory cell array and storing the read data in a page buffer circuit; performing a data output operation of outputting the read data stored in the page buffer circuit; and outputting, by the memory controller, a pre-resume command to the memory device between a first time at which the data read operation is complete and a second time at which the data out operation starts.

The method for operating a memory system may further include resuming the suspended data program operation or the suspended data erase operation. The data output operation may be performed in parallel with the resumed data program operation or the resumed data erase operation.

The method for operating a memory system may further include determining whether the memory device is in a state that satisfies a pre-defined pre-resume condition between the first time and the second time.

The memory controller may output the pre-resume command to the memory device when the pre-resume condition is satisfied and the memory controller may output a data output command to the memory device without outputting the pre-resume command when the pre-resume condition is not satisfied.

In still another aspect, embodiments of the disclosure may provide a memory device including: a memory cell array including a plurality of memory cells; a control logic configured to perform a data read operation of reading read data from the memory cell array in response to a read command; a page buffer circuit including a read buffer and a program buffer, and being configured to store the read data read from the memory cell array in the read buffer; and a data input/output circuit configured to output the read data stored in the page buffer circuit, to an outside of the memory device.

The control logic may resume the suspended data program operation or the suspended data erase operation in response to a pre-resume command between a first time and a second time, the first time being at which the data read operation is complete, the second time being at which the control logic may perform a data output operation of outputting the read data stored in the page buffer circuit to the outside in response to a data output command, the data output command being received after the pre-resume command.

The control logic, when the data read operation is complete, before or after receiving the pre-resume command, may cache the read data stored in the read buffer in a cache, and may output the read data cached in the cache to the outside in response to the data output command.

The program buffer may become a deactivated state in response to the suspend command, and transitions from the deactivated state to an activated state in response to the pre-resume command and the memory device may perform the resumed data program operation and the data output operation in parallel.

In yet another aspect, embodiments of the disclosure may provide a memory device including: a memory cell array including a plurality of memory cells; a control logic configured to read read data from the memory cell array or program program data to the memory cell array; a page buffer circuit including a read buffer that stores the read data and a program buffer that stores the program data; and a data input/output circuit configured to output the read data stored in the read buffer to an outside of the memory device, and receive the program data to store the program data in the program buffer.

The data input/output circuit may output the read data stored in the read buffer to the outside for a first period, and the control logic may program the program data stored in the program buffer to the memory cell array for a second period that overlaps with the first period.

In still yet another aspect, embodiments of the disclosure may provide a memory controller including: a memory interface configured to communicate with a memory device, the memory device including a memory cell array and a page buffer circuit; and a control circuit configured to output a suspend command to the memory device to suspend a data program operation or a data erase operation being performed in the memory device, output a read command to the memory device to store read data read from the memory cell array in the page buffer circuit, and output a pre-resume command to the memory device before a data output operation of outputting the read data stored in the page buffer circuit to an outside of the memory device starts.

The memory device may resume the suspended data program operation or the suspended data erase operation in response to the pre-resume command. The control circuit may output a data output command to the memory device after outputting the pre-resume command to the memory device, and may receive the read data from the memory device through the data output operation, the data output operation being performed in parallel with the resumed data program operation or the resumed data erase operation.

The control circuit may determine whether the memory device is in a state that satisfied a pre-defined pre-resume condition, after the read data is stored in the page buffer circuit and before the read data is outputted from the page buffer circuit, may output the pre-resume command to the memory device when the pre-resume condition is satisfied, and may output the data output command to the memory device without outputting the pre-resume command when the pre-resume condition is not satisfied.

When the control circuit outputs the data output command to the memory device without outputting the pre-resume command, the control circuit may output a resume command to the memory device after receiving the read data from the memory device in response to the data output command. The memory device may resume the suspended data program operation or the suspended data erase operation in response to the resume command.

According to the embodiments of the disclosure, it is possible to provide a memory device, a memory controller, a memory system and a method for operating the memory system capable of improving read quality, program quality and erase quality in a balanced manner.

Also, according to the embodiments of the disclosure, it is possible to provide a memory device, a memory controller, a memory system and a method for operating the memory system capable of preferentially improving read quality and substantially preventing program quality or erase quality from being degraded due to the improvement in read quality.

Further, according to the embodiments of the disclosure, it is possible to provide a memory device, a memory controller, a memory system, and a method for operating the memory system with a relatively fast operation speed by substantially simultaneously processing, in parallel, different kinds of operations that cannot be simultaneously processed in a conventional memory system.

BRIEF DESCRIPTION OF THE DRAWINGS

FIGS. 9(a), 9(b), and 10 are diagrams to illustrate a pre-resume based parallel processing technique to improve both read quality and program quality in the case where a data read process is started after a data program process has been started, in a memory system in accordance with embodiments of the disclosure.

FIG. 15(a) illustrates a case of using a suspend and resume technique and FIG. 15(b) illustrates a case of using a pre-resume based parallel processing technique, in a memory system in accordance with an embodiment of the disclosure.

DETAILED DESCRIPTION

Figure 1:
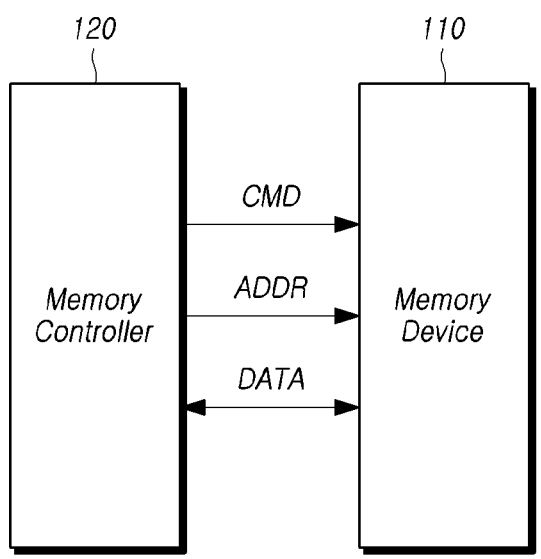
FIG. 1 is a diagram illustrating a memory system in accordance with an embodiment of the disclosure.

Hereinafter, embodiments of the disclosure will be described in detail with reference to the accompanying drawings. In the following description, the same elements may be designated by the same reference numerals although they are shown in different drawings. Further, in the following description of the disclosure, a detailed description of known functions and configurations incorporated herein may be omitted when it may make the subject matter of the disclosure rather unclear. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," and "the," this may include a plural of that noun unless specifically stated otherwise.

Also, in describing the components of the disclosure, there may be terms used like first, second, A, B, (a), and (b). These are solely for the purpose of differentiating one component from the other but not to imply or suggest the substances, order, sequence, or number of the components.

In descriptions for the positional relationships of components, in the case where it is described that at least two components are "connected," "coupled," or "linked," it is to be understood that the at least two components may be directly "connected," "coupled," or "linked" but may be indirectly "connected," "coupled," or "linked" with another component interposed between the two components. Here, another component may be included in at least one of the at least two components which are "connected," "coupled," or "linked" with each other.

In descriptions for temporal relationships of components, an operating method or a fabricating method, in the case where pre and post relationships in terms of time or pre and post relationships in terms of time are described, for example, by "after," "following," "next" or "before," non-continuous cases may be included unless "immediately" or "directly" is used.

In the case where a numerical value for a component or its corresponding information (e.g., level, etc.) is mentioned, even though there is no separate explicit description, the numerical value or its corresponding information can be interpreted as including an error range that may be caused by various factors (for example, a process variable, an internal or external shock, noise, etc.).

FIG. 1 is a diagram a memory system 100 in accordance with an embodiment of the disclosure.

Referring to FIG. 1, the memory system 100 may include a memory device 110 which stores data, and a memory controller 120 which controls the memory device 110.

The memory device 110 may perform operations such as a program operation (also referred to as a write operation) for programming (writing) therein data DATA inputted from the outside, a read operation for reading data DATA programmed therein and providing the read data DATA to the outside, and an erase operation for erasing data DATA programmed therein.

The memory controller 120 may provide various commands CMD and addresses ADDR to the memory device 110, for performing operations of the memory device 110. Also, the memory controller 120 may receive data DATA from the memory device 110 or may provide data DATA to the memory device 110.

In an embodiment, the memory controller 120 may control the memory device 110 in response to a program request or a read request received from a host.

For example, the memory controller 120 may transmit a program command CMD and an address ADDR to the memory device 110 in response to a program request received from the host. The memory controller 120 may provide data DATA to be programmed, to the memory device 110. The address ADDR transmitted to the memory device 110 by the memory controller 120 may be a physical address of the memory device 110.

For another example, the memory controller 120 may transmit a read command CMD and an address ADDR to the memory device 110 in response to a read request received from the host. The memory controller 120 may receive, from the memory device 110, data DATA read from the memory device 110.

In another embodiment, the memory controller 120 may control an operation of the memory device 110 regardless of or without a request of the host.

As described above, the memory device 110 may perform operations such as program, read, and erase operations, in response to signals indicating commands CMD and addresses ADDR received from the memory controller 120. The memory device 110 may receive a command CMD and an address ADDR from the memory controller 120, and may perform an operation (a read, program or erase operation) corresponding to the command CMD, for an area selected by the address ADDR in a memory cell array. Hereinafter, 'a program operation (or a data program operation) for memory cells coupled to a word line' and 'a read operation (or a data read operation) for memory cells coupled to a word line' may indicate 'a program operation for a word line' and 'a read operation for a word line,' respectively.

The memory device 110 may be realized into various types such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM), and a spin transfer torque random access memory (STT-RAM).

The memory device 110 may be realized in a three-dimensional array structure. Embodiments of the disclosure may be applied to not only a flash memory device in which a charge storage layer is configured by a conductive floating gate but also a charge trap flash (CTF) in which a charge storage layer is configured by a dielectric layer.

Meanwhile, each of the memory device 110 and the memory controller 120 in the memory system 100 may be provided as one chip, one package, or one module. Alternatively, both of the memory device 110 and the memory controller 120 may be realized by being integrated into one chip, one package, or one module.

In an embodiment, the memory controller 120 and a host (not shown) may be devices which are separated from each other. In other embodiments, the memory controller 120 and the host may be realized by being integrated into one device. Hereinafter, for the sake of convenience in explanation, it will be described as an example that the memory controller 120 and the host are devices which are separated from each other.

Figure 2:
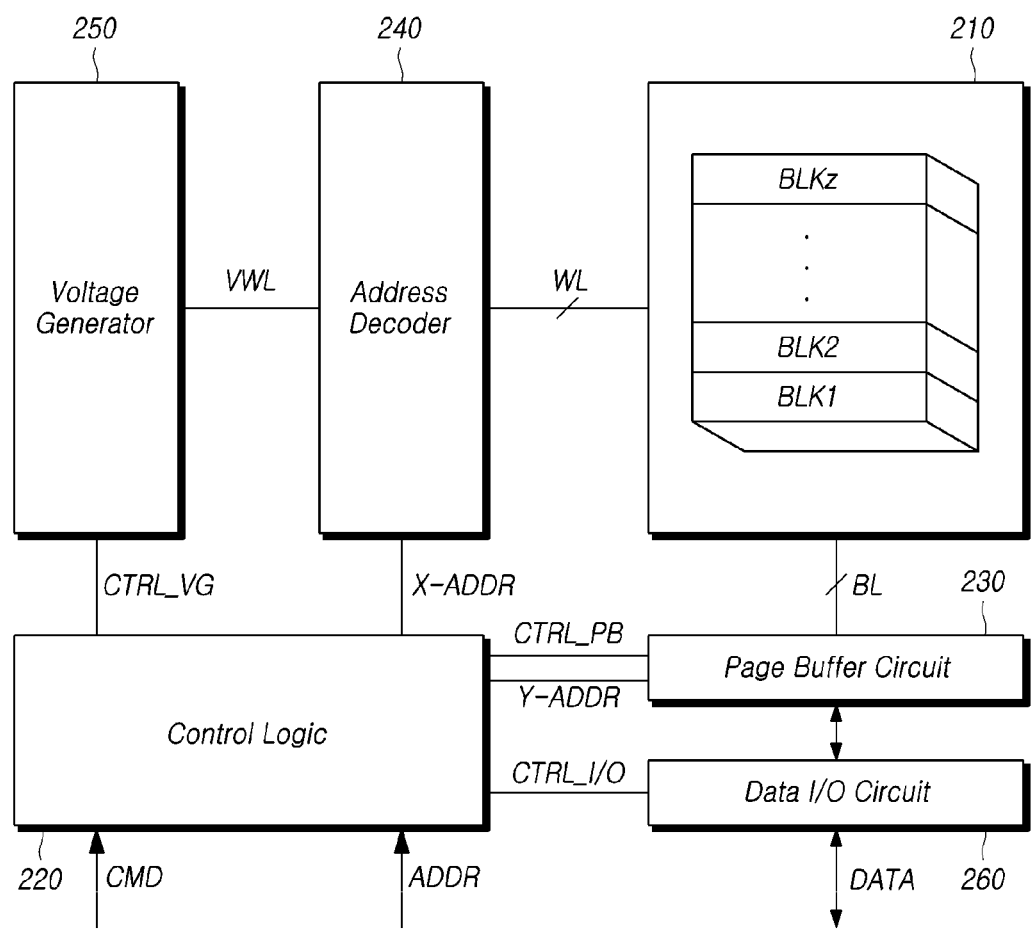
FIG. 2 is a diagram illustrating a memory device in accordance with an embodiment of the disclosure.

FIG. 2 is a diagram of a memory device 110 in accordance with an embodiment of the disclosure. The memory device 110 in FIG. 2 may be suitable for use as the memory device 110 in FIG. 1.

Referring to FIG. 2, the memory device 110 includes a memory cell array 210, a control logic 220, a page buffer circuit 230, an address decoder 240, a voltage generator 250, and a data input/output circuit 260.

The memory cell array 210 may include a plurality of memory blocks BLK1 to BLKz. In the plurality of memory blocks BLK1 to BLKz, a plurality of word lines WL and a plurality of bit lines BL may be disposed, and a plurality of memory cells MC may be arranged. For example, the plurality of memory cells may be flash memory cells. However, embodiments of the disclosure are not limited thereto, and the plurality of memory cells may be resistive memory cells such as a resistive RAM (RRAM), a phase change RAM (PRAM), or a magnetic RAM (MRAM). For example, the plurality of memory cells may be nonvolatile memory cells, and may be configured by nonvolatile memory cells which have vertical channel structures.

The memory cell array 210 may be configured by a memory cell array of a two-dimensional structure, or may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) which stores 1-bit data. For another instance, each of the plurality of memory cells included in the memory cell array 210 may be a multi-level cell (MLC) which stores 2-bit data. For still another instance, each of the plurality of memory cells included in the memory cell array 210 may be a triple level cell (TLC) which stores 3-bit data. For yet another instance, each of the plurality of memory cells included in the memory cell array 210 may be a quad level cell (QLC) which stores 4-bit data. For still yet another instance, the memory cell array 210 may include a plurality of memory cells, each of which stores 5 or more-bit data.

Referring to FIG. 2, the control logic 220, the address decoder 240, the page buffer circuit 230, and the voltage generator 250 may operate as a peripheral circuit which drives the memory cell array 210.

The control logic 220 may generally control various operations in the memory device 110, based on a command CMD and an address ADDR received from the memory controller 120. The page buffer circuit 230 may be coupled to the plurality of memory blocks BLK1 to BLKz through the plurality of bit lines BL. The address decoder 240 may be coupled to the plurality of memory blocks BLK1 to BLKz through the plurality of word lines WL. The voltage generator 250 may provide a word line voltage VWL to the address decoder 240. The word line voltage VWL may be, for example, a program voltage, a read voltage, or a pass voltage. The data input/output circuit 260 may be coupled to the page buffer circuit 230 through data lines, and may provide inputted data (or input data) DATA to the page buffer circuit 230 or output data DATA provided from the page buffer circuit 230, to the outside.

The control logic 220 may output a voltage control signal CTRL_VG to the voltage generator 250 to perform a program operation and a verify operation in response to a program command CMD. The control logic 220 may output a column address Y-ADDR to the page buffer circuit 230 and output a row address X-ADDR to the address decoder 240 based on an address ADDR, thereby specifying a selected memory cell. The control logic 220 may provide a control signal CTRL_PB, which controls the operation of the page buffer circuit 230, to the page buffer circuit 230.

The address decoder 240 may select any one from the plurality of memory blocks BLK1 to BLKz of the memory cell array 210 in response to the row address X-ADDR. The address decoder 240 may select a selected word line from a plurality of word lines of the selected memory block.

The address decoder 240 may transfer the word line voltage VWL from the voltage generator 250 to a word line WL of the selected memory block.

The page buffer circuit 230 may operate as a program driver or a sense amplifier depending on an operation mode. In a program operation, the page buffer circuit 230 may transfer a bit line voltage corresponding to data to be written to a bit line BL of the memory cell array 210. In a read operation, the page buffer circuit 230 may sense data stored in a selected memory cell, through a bit line BL coupled with a sensing node, under the control of a bit line sensing signal. The page buffer circuit 230 may latch the sensed data and output the latched data to the outside.

Figure 3:
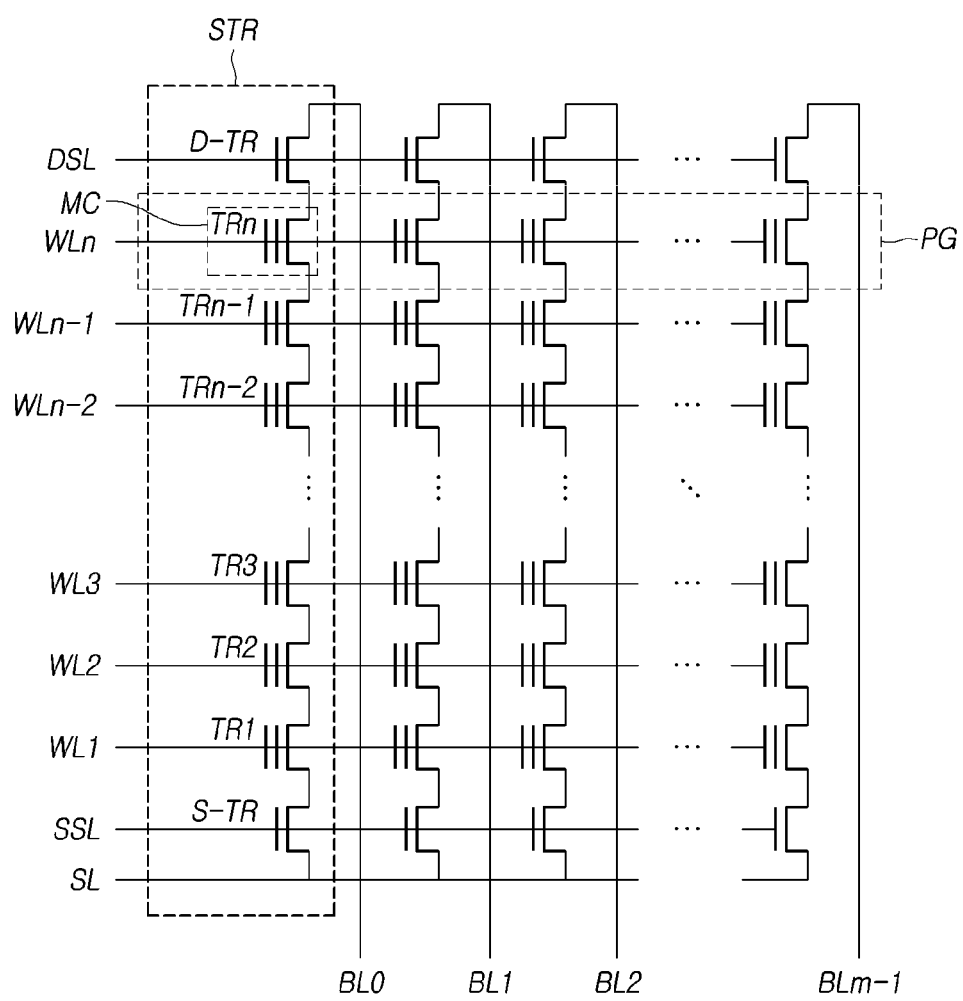
FIG. 3 is a diagram illustrating a structure of a memory block of a memory device in accordance with an embodiment of the disclosure.

FIG. 3 is a diagram illustrating a memory block BLK of a memory device (e.g., the memory device 110 in FIG. 2) in accordance with an embodiment of the disclosure.

Referring to FIG. 3, the memory block BLK includes n number of word lines WL1 to WLn and m number of bit lines BL0 to BLm-1.

Referring to FIG. 3, each memory block BLK included in the memory device 110 may be configured, for example, as a plurality of pages PG and a plurality of strings STR are disposed in directions intersecting with each other.

The plurality of pages PG correspond to the plurality of word lines WL1 to WLn, and the plurality of strings STR correspond to the plurality of bit lines BL0 to BLm-1.

In the memory block BLK, the plurality of word lines WL1 to WLn and the plurality of bit lines BL0 to BLm-1 may be disposed to intersect with each other. For example, each of the plurality of word lines WL1 to WLn may be disposed in a row direction, and each of the plurality of bit lines BL0 to BLm-1 may be disposed in a column direction.

For another example, each of the plurality of word lines WL1 to WLn may be disposed in a column direction, and each of the plurality of bit lines BL0 to BLm-1 may be disposed in a row direction.

As the plurality of word lines WL1 to WLn and the plurality of bit lines BL0 to BLm-1 intersect with each other, a plurality of memory cells MC may be defined. A plurality of transistors TR1 to TRn may be disposed in the plurality of memory cells MC, respectively.

For example, each of the plurality of transistors TR1 to TRn may include a drain, a source, and a gate. The drain (or source) of each of the plurality of transistors TR1 to TRn may be coupled with a corresponding bit line BL directly or via another transistor. The source (or drain) of each of the plurality of transistors TR1 to TRn may be coupled with a source line (e.g., a ground) directly or via another transistor. The gate of each of the plurality of transistors TR1 to TRn may include a floating gate which is surrounded by a dielectric and a control gate to which a gate voltage is applied from a corresponding one of the word lines WL1 to WLn.

In each of the plurality of memory blocks BLK1 to BLKz in FIG. 2, two outermost word lines WL1 and WLn among the plurality of word lines WL1 to WLn include a first outermost word line WL1 and a second outermost word line WLn.

In each of the plurality of memory blocks BLK1 to BLKz, a first select line (e.g., a source selection line SSL) may be additionally disposed outside the first outermost word line WL1, and a second select line (e.g., a drain select line DSL) may be additionally disposed outside the second outermost word line WLn.

In each of the plurality of memory blocks BLK1 to BLKz, a first select transistor S-TR having a gate to which the first select line SSL is coupled and a second select transistor D-TR having a gate to which the second select line DSL is coupled may be additionally disposed.

At least one dummy word line may be additionally disposed between the first outermost word line WL1 and the first select line SSL. At least one dummy word line may also be additionally disposed between the second outermost word line WLn and the second select line DSL.

Referring to FIGS. 2 and 3, in the memory device 110, there exist a core area in which memory cells MC are gathered and an auxiliary area which corresponds to the remaining area except the core area and supports the operation of the memory cell array 210.

The core area may be configured by pages PG and strings STR. In such a core area, the plurality of word lines WL1 to WLn and the plurality of bit lines BL0 to BLm-1 are disposed to intersect with each other.

The plurality of word lines WL1 to WLn may be coupled with the address decoder 240, and the plurality of bit lines BL0 to BLm-1 may be coupled with the page buffer circuit 230.

The plurality of word lines WL1 to WLn correspond to the plurality of pages PG. For example, as illustrated in FIG. 3, each of the plurality of word lines WL1 to WLn may correspond to one page PG. Unlike this, in the case where the size of each of the plurality of word lines WL1 to WLn is large, each of the plurality of word lines WL1 to WLn may correspond to at least two (for example, two or four) pages PG. Page PG is a minimum unit in performing a program operation and a read operation. In the program operation and the read operation, all memory cells MC in the same page PG may simultaneously perform the corresponding operations.

The plurality of bit lines BL may be coupled with the page buffer circuit 230 while being divided into odd-numbered bit lines BL and even-numbered bit lines BL.

In order to access memory cells MC, first, an address may be entered into the core area through the address decoder 240 and the page buffer circuit 230 via input/output terminals, and may designate target memory cells. Designating target memory cells indicates accessing memory cells MC positioned at sites where the word lines WL1 to WLn coupled with the address decoder 240 and the bit lines BL0 to BLm-1 coupled with the page buffer circuit 230 intersect with each other, to program data to the memory cells MC or read out programmed data from the memory cells MC.

A page PG in a first direction (e.g., an X-axis direction) is bound (coupled) by a common line which is referred to as a word line WL, and a string STR in a second direction (e.g., a Y-axis direction) is bound (coupled) by a common line which is referred to as a bit line BL. Being bound in common indicates that corresponding memory cells MC are structurally coupled with one another by the same material and substantially the same voltage is simultaneously applied to the memory cells MC when a voltage is applied thereto. Of course, as a memory cell MC which is coupled in series and is positioned at an intermediate position or a last position is influenced by a voltage drop in a preceding memory cell MC, voltages applied to a first memory cell MC and a last memory cell MC may be slightly different from each other.

Since data is programmed and read via a page buffer circuit 230 (or a data register) in all data processing operations of the memory device 110, the page buffer circuit 230 plays a key role. If data processing of the page buffer circuit 230 is delayed, all the other areas need to wait until the page buffer circuit 230 completes the data processing. Also, if the performance of the page buffer circuit 230 is degraded, the overall performance of the memory device 110 may be degraded.

Referring to the illustration of FIG. 3, in one string STR, the plurality of transistors TR1 to TRn which are coupled with the plurality of word lines WL1 to WLn, respectively, may exist. Areas where the plurality of transistors TR1 to TRn exist correspond to memory cells MC. The plurality of transistors TR1 to TRn are transistors, each of which includes a control gate (CG) and a floating gate (FG) as described above.

The plurality of word lines WL1 to WLn include the two outermost word lines WL1 and WLn. The second select line DSL may be additionally disposed outside the second outermost word line WLn which is more adjacent to the page buffer circuit 230 in terms of signal path between the two outermost word lines WL1 and WLn, and the first select line SSL may be additionally disposed outside the first outermost word line WL1 between the two outermost word lines WL1 and WLn.

The second select transistor D-TR which is on-off controlled by the second select line DSL is a transistor which has only a gate electrode coupled with the second select line DSL and does not include a floating gate (FG). The first select transistor S-TR which is on-off controlled by the first select line SSL is a transistor which has only a gate electrode coupled with the first select line SSL and does not include a floating gate (FG).

The second select transistor D-TR serves as a switch which turns on or off the coupling between a corresponding string STR and the page buffer circuit 230. The first select transistor S-TR serves as a switch which turns on or off the coupling between the corresponding string STR and a source line SL. That is to say, the second select transistor D-TR and the first select transistor S-TR are positioned at both ends of the corresponding string STR, and serve as gatekeepers which couple and decouple signals.

In a program operation, because it is necessary to fill electrons in a target memory cell MC of a bit line BL which is to be programmed, the memory system 100 turns on the second select transistor D-TR by applying a predetermined turn-on voltage (Vcc) to the gate electrode of the second select transistor D-TR, and turns off the first select transistor S-TR by applying a predetermined turn-off voltage (e.g., 0V) to the gate electrode of the first select transistor S-TR.

In a read operation or a verify operation, the memory system 100 turns on both the second select transistor D-TR and the first select transistor S-TR. Accordingly, since current may be discharged to the source line SL corresponding to the ground through the corresponding string STR, a voltage level of the bit line BL may be measured. However, in the read operation, there may be a time difference between on-off timings of the second select transistor D-TR and the first select transistor S-TR.

In an erase operation, the memory system 100 may supply a predetermined voltage (e.g., +20V) to a substrate through the source line SL. In the erase operation, the memory system 100 in FIG. 1 floats both the second select transistor D-TR and the first select transistor S-TR, thereby providing substantially infinite resistance. Accordingly, the memory system 100 is structured such that the second select transistor D-TR and the first select transistor S-TR do not function and electrons may operate due to a potential difference only between a floating gate (FG) and the substrate.

Figure 4:
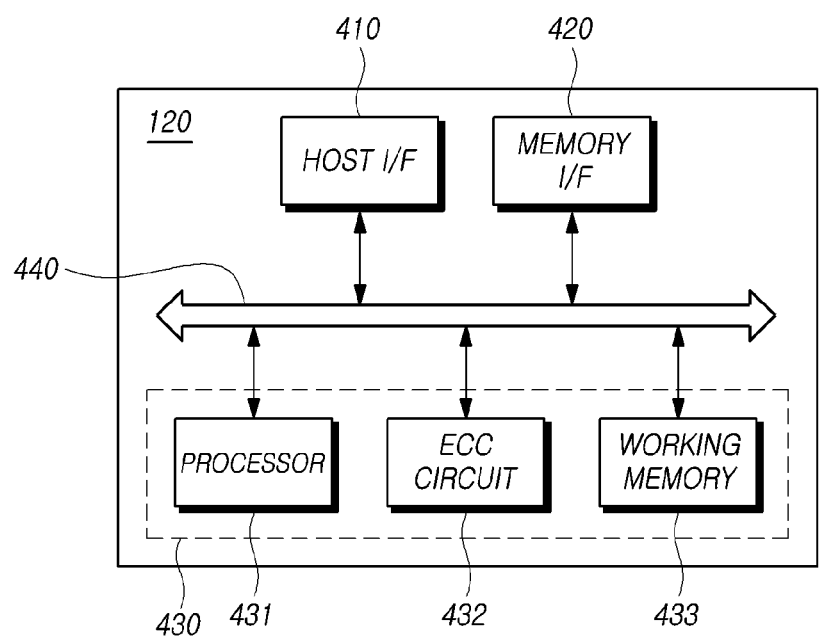
FIG. 4 is a diagram illustrating a memory controller in accordance with an embodiment of the disclosure.

FIG. 4 is a diagram illustrating a memory controller (e.g., the memory controller 120 in FIG. 1) in accordance with an embodiment of the disclosure.

Referring to FIG. 4, the memory controller 120 includes a host interface 410, a memory interface 420, a control circuit 430, and a bus 440.

The control circuit 430 performs general control operations of the memory controller 120, thereby controlling the operations of the memory device 110.

The host interface 410 provides an interface for communication with a host (not shown). The control circuit 430 may receive various requests (e.g., a read request, a program request, and an erase request) through the host interface 410 from the host.

The memory interface 420 is coupled with a memory device (e.g., the memory device 110 in FIG. 2) and thereby provides an interface for communication with the memory device 110. That is to say, the memory interface 420 may be configured to provide the interface between the memory device 110 and the memory controller 120 in response to the control of the control circuit 430. The control circuit 430 transmits various commands CMD and addresses ADDR to the memory device 110 through the memory interface 420. The control circuit 430 may exchange data DATA with the memory device 110 through the memory interface 420.

The control circuit 430 performs the general control operations of the memory controller 120, thereby controlling the operations of the memory device 110. To this end, for instance, the control circuit 430 may include a processor 431, or a working memory 433, or both, and may further include an error detection and correction circuit (ECC circuit) 432.

The processor 431 may control general operations of the memory controller 120, and may perform a logic calculation. The processor 431 may communicate with the host through the host interface 410, and may communicate with the memory device 110 through the memory interface 420.

The processor 431 may perform the function of a flash translation layer (FTL). The processor 431 may translate a logical block address (LBA), provided by the host, into a physical block address (PBA) through the flash translation layer (FTL). The flash translation layer (FTL) may receive the logical block address (LBA) and translate the received logical block address (LBA) into the physical block address (PBA), by using a mapping table.

There are various address mapping methods of the flash translation layer, depending on a mapping unit. Representative address mapping methods include a page mapping method, a block mapping method, and a hybrid mapping method.

The processor 431 is configured to randomize data received from the host. For example, the processor 431 may randomize data received from the host, by using a randomizing seed. Randomized data as data to be stored is provided to the memory device 110 and is programmed to the memory cell array.

The processor 431 is configured to derandomize data received from the memory device 110, in a read operation. For example, the processor 431 may derandomize data received from the memory device 110, by using a derandomizing seed. Derandomized data may be outputted to the host.

The processor 431 may control the operation of the memory controller 120 by executing a firmware. In other words, in order to control general operations of the memory controller 120 and perform a logic calculation, the processor 431 may execute (or drive) a firmware loaded to the working memory 433 upon booting.

The firmware as a program to be executed in the memory system 100 may include various functional layers.

For example, the firmware may include one or more of a flash translation layer (FTL) which performs a translating function between a logical address requested to the memory system 100 from the host and a physical address of the memory device 110, a host interface layer (HIL) which serves to analyze a command requested to the memory system 100 as a storage device from the host and transfer the command to the flash translation layer (FTL), a flash interface layer (FIL) which transfers a command instructed from the flash translation layer (FTL) to the memory device 110, and so forth.

For instance, such a firmware may be stored in the memory device 110 and then be loaded to the working memory 433.

The working memory 433 may store a firmware, a program code, a command, and data which are necessary to drive the memory controller 120. The working memory 433, for example, as a volatile memory, may include one or more of an SRAM (static RAM), a DRAM (dynamic RAM), and an SDRAM (synchronous DRAM).

The error detection and correction circuit 432 may be configured to detect an error bit of checking target data and correct the detected error bit, by using an error correction code. Here, the checking target data may be, for example, data stored in the working memory 433, data read from the memory device 110, or the like.

The error detection and correction circuit 432 may be realized to decode data by using an error correction code. The error detection and correction circuit 432 may be realized by various code decoders. For example, a decoder which performs unsystematic code decoding or a decoder which performs systematic code decoding may be used.

For example, the error detection and correction circuit 432 may detect an error bit for each read data, in the unit of sector. Namely, each read data may be constituted by a plurality of sectors. A sector may correspond to a data unit smaller than a page as a read unit of a flash memory. Sectors constituting each read data may be matched with one another by the medium of an address.

The error detection and correction circuit 432 may calculate a bit error rate (BER), and may determine whether an error is correctable or not, in the unit of sector. For example, in the case where a bit error rate (BER) is higher than a reference value, the error detection and correction circuit 432 may determine that a corresponding sector is uncorrectable or a fail. On the other hand, in the case where a bit error rate (BER) is lower than the reference value, the error detection and correction circuit 432 may determine that a corresponding sector is correctable or a pass.

The error detection and correction circuit 432 may perform an error detection and correction operation sequentially for all read data. In the case where a sector included in read data is correctable, the error detection and correction circuit 432 may omit an error detection and correction operation for a corresponding sector for next read data. If the error detection and correction operation for all read data is ended in this way, the error detection and correction circuit 432 may detect a sector which is determined to be uncorrectable to the last. There may be one or more sectors that are determined to be uncorrectable. The error detection and correction circuit 432 may transfer information (for example, address information) on a sector which is determined to be uncorrectable, to the processor 431.

The bus 440 may be configured to provide channels among the components 410, 420, 430, 431, 432, and 433 of the memory controller 120. The bus 440 may include, for example, a control bus for transferring various control signals, commands and the likes, a data bus for transferring various data, and so forth.

The above-described components 410, 420, 430, 431, 432, 433, and 440 of the memory controller 120 are for an illustration purpose only. Some of the above-described components 410, 420, 430, 431, 432, 433, and 440 of the memory controller 120 may be omitted, or some of the above-described components 410, 420, 430, 431, 432, 433, and 440 of the memory controller 120 may be integrated into one. As the case may be, in addition to the above-described components 410, 420, 430, 431, 432, 433, and 440 of the memory controller 120, one or more other components may be added.

Figure 5:
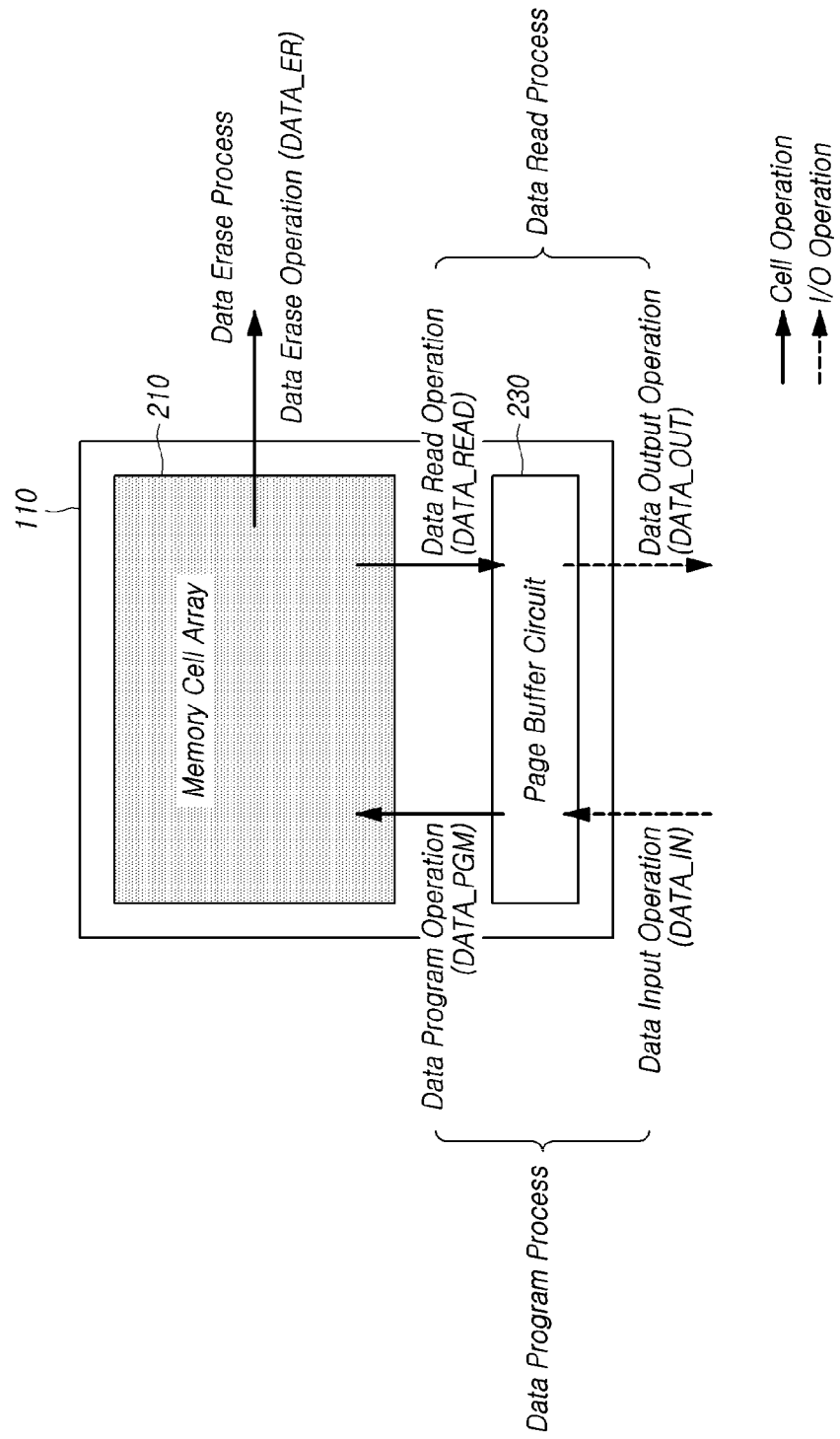
FIG. 5 is a diagram to illustrate three main operation processes of a memory device in accordance with an embodiment of the disclosure.

FIG. 5 is a diagram to illustrate three main operation processes of a memory device 110 in accordance with an embodiment of the disclosure.

Referring to FIG. 5, the three main operation processes of the memory device 110 include a data program process, a data read process, and a data erase process.

The data program process may include a data input operation DATA_IN of receiving data (or program data) from the outside (e.g., the memory controller 120 in FIG. 1) and storing the received data in a page buffer circuit 230, and a data program operation DATA_PGM of programming the data stored in the page buffer circuit 230 to a memory cell array 210. The data program operation DATA_PGM may be an operation of applying a program voltage pulse to the control gate of a transistor in a memory cell (e.g., the memory cell MC in FIG. 3) and thereby charging electrons to the floating gate.

The data read process may include a data read operation DATA_READ of reading data programmed to the memory cell array 210 and storing the read data in the page buffer circuit 230, and a data output operation DATA_OUT of outputting the data stored in the page buffer circuit 230 to the outside (e.g., the memory controller 120). The data read operation DATA_READ may be an operation of accessing the address of a memory cell MC and then sensing a status of the memory cell MC. Sensing a status of the memory cell MC may be an operation of reading out data stored in the floating gate.

The data erase process may include a data erase operation DATA_ER of erasing data programmed in the memory cell array 210.

The data program operation DATA_PGM, the data read operation DATA_READ, and the data erase operation DATA_ER are referred to as cell operations that are performed inside the memory device 110, whereas the data input operation DATA_IN and the data output operation DATA_OUT are referred to as input/output (I/O) operations that are performed between the memory device 110 and the memory controller 120.

Figure 6:
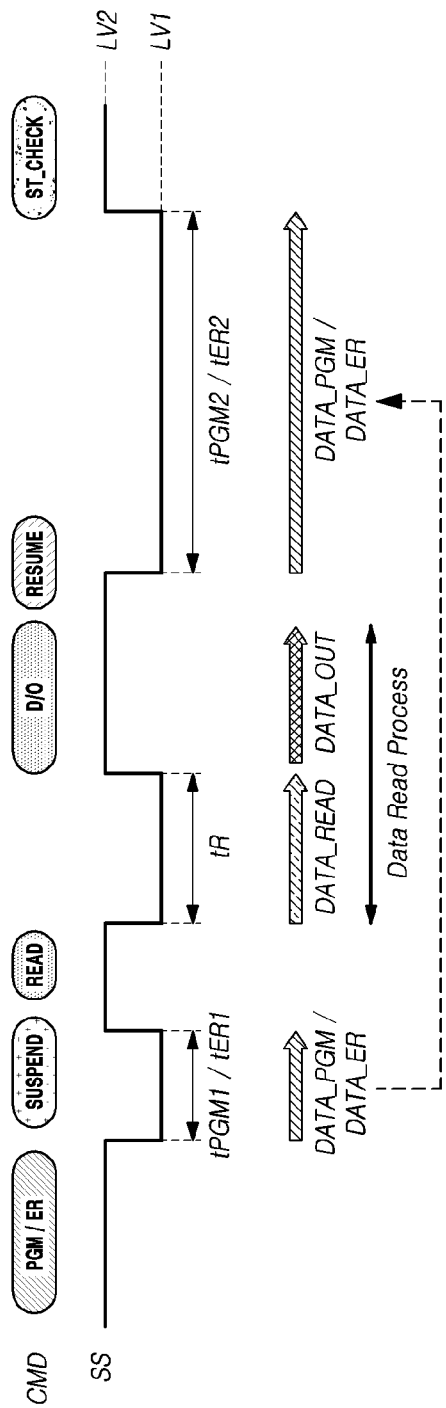
FIGS. 6 and 7 are an operation timing diagram and a flow chart, respectively, in the case where a suspend and resume technique is applied, in a memory system in accordance with an embodiment of the disclosure.
Figure 7:
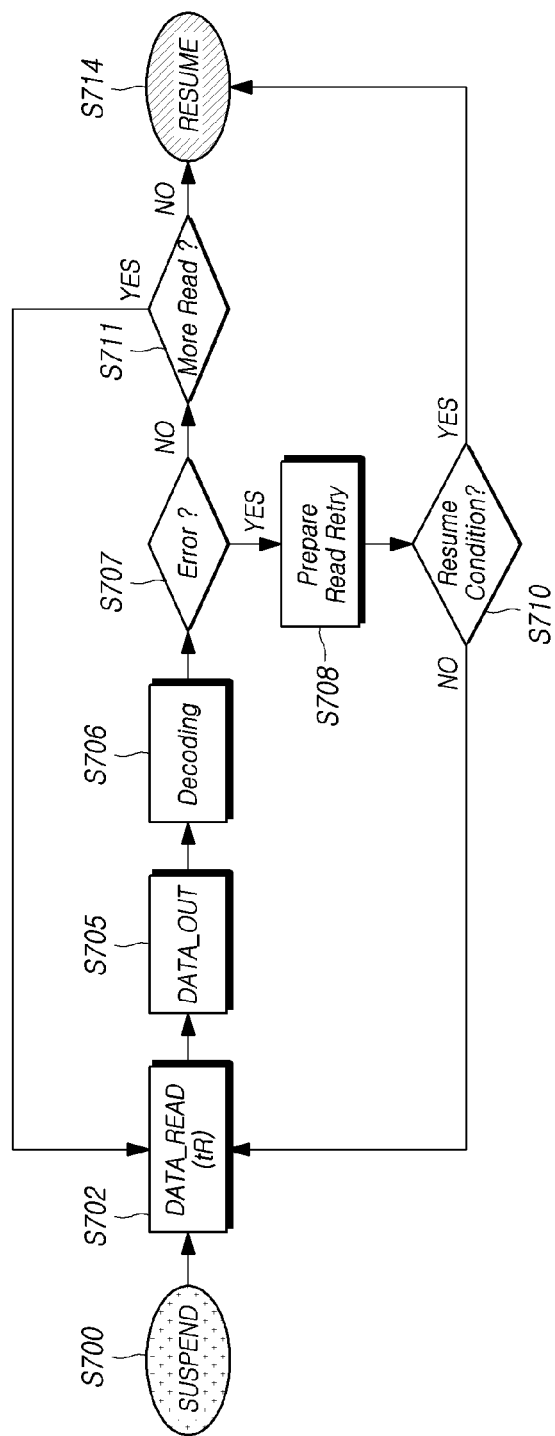

FIGS. 6 and 7 are an operation timing diagram and a flow chart, respectively, when a suspend and resume technique is applied to a memory system (e.g., the memory system 100 in FIG. 1) in accordance with embodiments of the disclosure.

In order to improve read quality of a data read process, in the case where the data program operation DATA_PGM or the data erase operation DATA_ER is currently being performed for a memory area to be read (e.g., any one memory die among a plurality of memory dies or any one memory block among a plurality of memory blocks), a memory controller (e.g., the memory controller 120 in FIG. 1) suspends the data program operation DATA_PGM or the data erase operation DATA_ER in a memory device (e.g., the memory device 110 in FIG. 1), and causes the data read process including the data read operation DATA_READ and the data output operation DATA_OUT to be performed in the memory device 110.

Thereafter, in a case where there is no more read command READ, a case where a read count is limited by a firmware policy, or a case where a read count is limited due to degradation in the reliability of the memory device 110, the memory controller 120 provides a resume command RESUME to the memory device 110. Accordingly, the memory device 110 resumes the suspended data program operation DATA_PGM or data erase operation DATA_ER in response to the resume command RESUME.

The above-described technique of suspending and resuming the data program operation DATA_PGM or the data erase operation DATA_ER to improve read quality is referred to as the suspend and resume technique.

In the following, the suspend and resume technique will be described in detail with reference to FIGS. 6 and 7.

FIGS. 6 and 7 are an operation timing diagram and a flow chart, respectively, when the data read process is started after the data program process or the data erase process is started.

Figure 8:
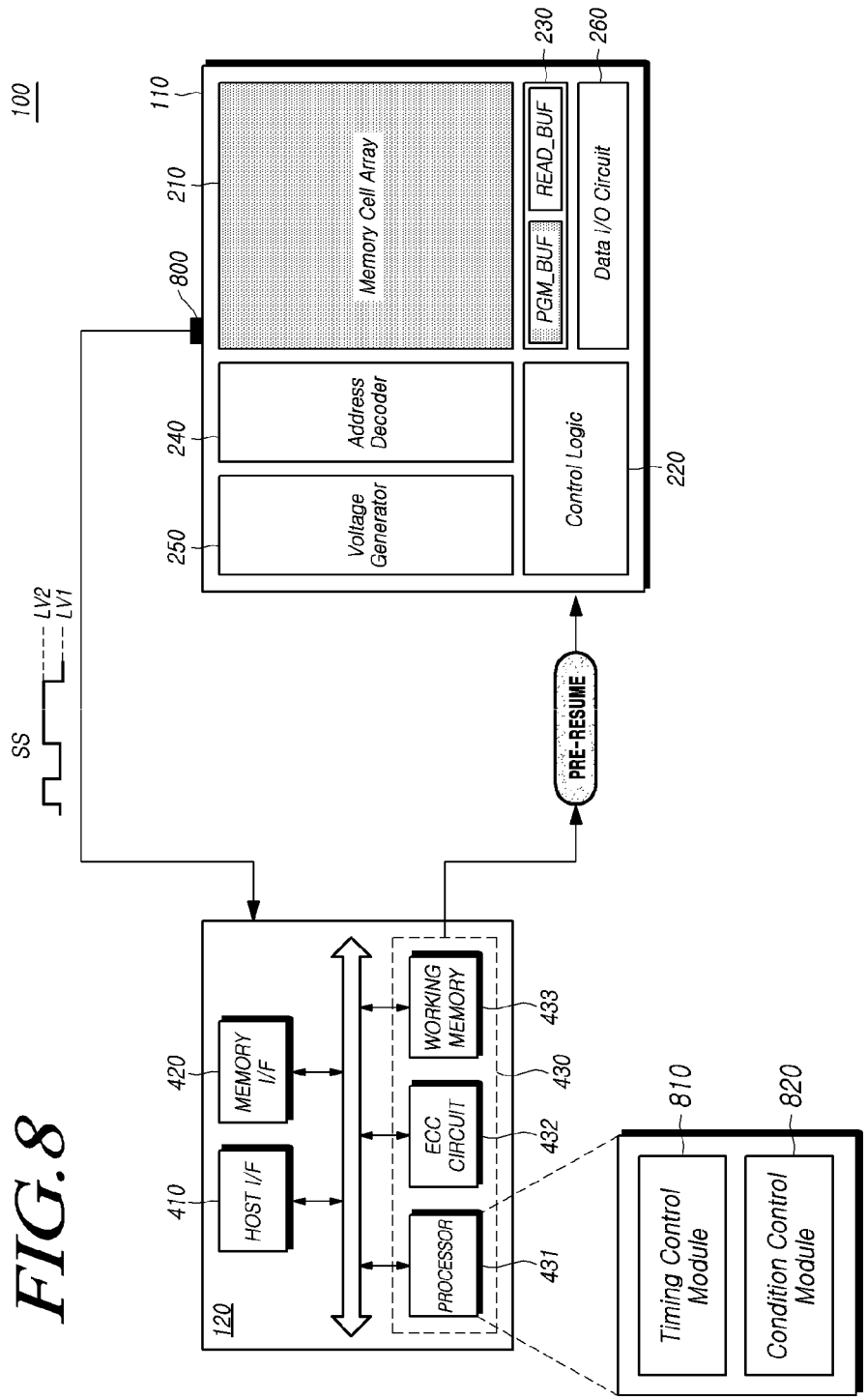
FIG. 8 is a diagram to illustrate a pre-resume based parallel processing technique for improving both read quality and another cell operation quality (program quality or erase quality), in a memory system in accordance with an embodiment of the disclosure.

Referring to FIG. 6, the memory device 110 may output a status signal SS having a first value (e.g., a first level voltage) LV1 and a second value (e.g., a second level voltage) LV2 that are different from each other and alternate with each other, through a pin (e.g., a status signal output pin 800 in FIG. 8). For example, the first level voltage LV1 may be a low level voltage, and the second level voltage LV2 may be a high level voltage. For another example, the first level voltage LV1 may be a high level voltage, and the second level voltage LV2 may be a low level voltage.

A first period in which the status signal SS has the first level voltage LV1 corresponds to a period in which the memory device 110 performs a cell operation such as the data program operation DATA_PGM, the data read operation DATA_READ, or the data erase operation DATA_ER.

A second period in which the status signal SS has the second level voltage LV2 corresponds to a period in which the memory device 110 performs no operation or the memory device 110 does not perform the cell operation DATA_PGM, DATA_READ or DATA_ER. For example, during the second period in which the status signal SS has the second level voltage LV2, the data input operation DATA_IN, or the data output operation DATA_OUT, or both may be performed.

Referring to FIG. 6, the memory controller 120 may check an operation status of the memory device 110 based on the status signal SS outputted from the memory device 110.

Referring to FIGS. 6 and 7, if the memory device 110 receives a suspend command SUSPEND from the memory controller 120 while performing the data program operation DATA_PGM for a first program time interval tPGM1 in response to a program command PGM or performing the data erase operation DATA_ER for a first erase time interval tER1 in response to an erase command ER, the memory device 110 suspends the data program operation DATA_PGM or the data erase operation DATA_ER that is being performed at S700.

When the memory controller 120 receives a read request READ REQ from a host, the memory controller 120 outputs the suspend command SUSPEND to the memory device 110 at S700, and outputs the read command READ to the memory device 110.

Accordingly, the memory device 110 suspends the data program operation DATA_PGM or the data erase operation DATA_ER that is being performed, in response to the suspend command SUSPEND, and starts the data read operation DATA_READ at S702.

Referring to FIGS. 6 and 7, the memory device 110 performs the data read operation DATA_READ for a read time interval tR at S702, and, when the data read operation DATA_READ has been completed, the memory device 110 changes the output voltage of the status signal SS from the first level voltage LV1 to the second level voltage LV2.

The memory controller 120 may confirm that the data read operation DATA_READ has been completed, through the voltage change from the first level voltage LV1 to the second level voltage LV2 of the status signal SS outputted from the memory device 110.

Referring to FIGS. 6 and 7, when the memory controller 120 confirms that the data read operation DATA_READ has been completed, the memory controller 120 outputs a data output command D/O to the memory device 110, and the memory device 110 performs the data output operation DATA_OUT in response to the data output command D/O at S705. Accordingly, read data stored in a read buffer (e.g., the read buffer READ_BUF in FIG. 8) through the data read operation DATA_READ is outputted to the outside (e.g., the memory controller 120) of the memory device 110.

While the data output operation DATA_OUT is performed in the memory device 110 at S705, the status signal SS outputted from the memory device 110 has the second level voltage LV2.

Referring to FIGS. 6 and 7, after the data output operation DATA_OUT is performed in the memory device 110 at S705, S706 at which the memory controller 120 decodes data received through the data output operation DATA_OUT of the memory device 110 and S707 at which the memory controller 120 checks whether the decoded data has an error may be additionally performed.

Referring to FIGS. 6 and 7, in the case where it is checked as a result of the checking at S707 that there is no error in the decoded data, the memory controller 120 checks whether there is another read command at S711.

If it is checked as a result of the checking at S711 that there is another read command, the memory controller 120 performs another data read operation DATA_READ at S702. If it is checked as a result of the checking at S711 that there is no more read command, the memory controller 120 outputs the resume command RESUME to the memory device 110 at S714.

Referring to FIGS. 6 and 7, in the case where it is checked as a result of the checking at S707 that there is an error, the memory controller 120 prepares a read retry at S708, and, if the preparation of the read retry has been completed, determines whether a resume condition is satisfied at S710.

If it is determined as a result of the determination at S710 that the resume condition is not satisfied, the memory controller 120 performs the read retry. If it is determined as a result of the determination at S710 that the resume condition is satisfied, the memory controller 120 outputs the resume command RESUME to the memory device 110 at S714.

The resume condition mentioned above may be determined as being satisfied, for example, in the case where a read count is limited or in the case where a time interval for which the data program operation DATA_PGM or the data erase operation DATA_ER is suspended by the suspend command SUSPEND is equal to or longer than a given threshold time interval (e.g., a predetermined threshold time interval). For example, a read count may be limited by a firmware policy or due to degradation in the reliability of the memory device 110.

Referring to FIGS. 6 and 7, if the data read process such as the data output operation DATA_OUT is completely performed in the memory device 110 and it is determined at S710 that the resume condition is satisfied, the memory controller 120 outputs the resume command RESUME to the memory device 110 at S714.

After S711 or S710, the memory device 110 resumes the data program operation DATA_PGM or the data erase operation DATA_ER that is suspended by the suspend command SUSPEND, in response to the received resume command RESUME, and thereby, performs the data program operation DATA_PGM for a second program time interval tPGM2 or performs the data erase operation DATA_ER for a second erase time interval tER2.

Thereafter, the memory controller 120 outputs a status check command ST_CHECK to the memory device 110, and thereby, checks whether the data program operation DATA_PGM or the data erase operation DATA_ER is normally complete in the memory device 110.

Referring to FIG. 6, when the suspend and resume technique is used, read quality may be improved, but program quality or erase quality may be degraded as the processing of the data program operation DATA_PGM or the data erase operation DATA_ER is delayed. For example, the processing of the data program operation DATA_PGM or the data erase operation DATA_ER may be delayed by a time interval for performing the data read process that includes the data read operation DATA_READ and the data output operation DATA_OUT, and thus the program quality of erase quality may be degraded.

In this regard, embodiments of the disclosure provide a "pre-resume based parallel processing technique" capable of improving program quality and erase quality while maintaining read quality at substantially the same level as the suspend and resume technique.

FIG. 8 is a diagram to illustrate the pre-resume based parallel processing technique for improving both read quality and another cell operation quality (e.g., program quality or erase quality), in a memory system 100 in accordance with an embodiment of the disclosure.

Referring to FIG. 8, in the memory system 100, a memory device 110 may include a memory cell array 210 and a page buffer circuit 230, and may perform, in response to a read command READ, a data read operation DATA_READ of storing read data read from the memory cell array 210, in the page buffer circuit 230.

After the data read operation DATA_READ is complete, before the data output operation DATA_OUT in which the read data stored in the page buffer circuit 230 is outputted to the outside of the memory device 110 is performed, the memory controller 120 may output a pre-resume command PRE-RESUME to the memory device 110.

In response to the pre-resume command PRE-RESUME, the memory device 110 may resume the data program operation DATA_PGM or the data erase operation DATA_ER that is suspended by the suspend command SUSPEND, and may perform the data output operation DATA_OUT of outputting the read data stored in the page buffer circuit 230 to the outside of the memory device 110, in parallel with the resumed data program operation DATA_PGM or data erase operation DATA_ER.

The term "parallel processing" in the disclosure may indicate that different kinds of operations are performed in parallel in the memory device 110. Such parallel processing may be commanded by the pre-resume command PRE-RESUME or the pre-resume command PRE-RESUME and the data output command D/O provided to the memory device 110 by the memory controller 120.

The different kinds of operations that are processed in parallel by the memory device 110 may include one cell operation (e.g., the data program operation DATA_PGM in which the memory device 110 programs data to the memory cell array 210 or the data erase operation DATA_ER in which the memory device 110 erases data in the memory cell array 210) and the data output operation DATA_OUT in which the memory device 110 outputs the read data stored in the page buffer circuit 230 to the outside of the memory device 110.

In order to perform the above-described parallel processing, the page buffer circuit 230 of the memory device 110 may include at least one read buffer READ_BUF and at least one program buffer PGM_BUF. The size of each read buffer READ_BUF and the size of each program buffer PGM_BUF may be the same as or different from each other. The numbers of read buffers READ_BUF and program buffers PGM_BUF in the page buffer circuit 230 may be the same as or different from each other. The read buffer READ_BUF and the program buffer PGM_BUF may be cache buffers.

Also, in order to perform the parallel processing, the memory device 110 may output the status signal SS having the first level voltage LV1 and the second level voltage LV2 that are different from each other and alternate with each other, through the status signal output pin 800. For example, the first level voltage LV1 may be a low level voltage, and the second level voltage LV2 may be a high level voltage. For another example, the first level voltage LV1 may be a high level voltage, and the second level voltage LV2 may be a low level voltage.

Further, in order to perform the pre-resume based parallel processing, the memory controller 120 may include a timing control module 810 which controls a timing for outputting the pre-resume command PRE-RESUME, and a condition control module 820 which determines whether to output the pre-resume command PRE-RESUME and determines whether to perform parallel processing.

In the case where it is determined by the condition control module 820 that the pre-resume based parallel processing is desirable and possible in the memory device 110, the memory controller 120 may output the pre-resume command PRE-RESUME at a timing that is determined by the timing control module 810.

The timing control module 810 of the memory controller 120 may receive the status signal SS which is outputted from the status signal output pin 800 of the memory device 110. The timing control module 810 of the memory controller 120 may determine an output timing of the pre-resume command PRE-RESUME based on the status signal SS. For example, the timing control module 180 may determine an output timing of the pre-resume command PRE-RESUME, such that the output timing is between a first time at which the status signal SS indicates that a data read operation DATA_READ has been completed and a second time at which the data output operation DATA_OUT starts, the status signal SS transitioning from a first level voltage LV1 to a second level voltage LV2 at the first time.

The timing control module 810, or the condition control module 820, or both may be included in the memory controller 120, and each may be realized by a software module or a hardware module.

For example, the timing control module 810, or the condition control module 820, or both may be a software module which is included in a processor 431 or is executed by the processor 431. In this case, as an example, the timing control module 810 and the condition control module 820 may be realized as program codes which are included in a firmware or the like. In another example, when each of the timing control module 810 and the condition control module 820 may be realized by a hardware module, the timing control module 810 and the condition control module 820 may be referred to as a timing control circuit 810 and a condition control circuit 820, respectively.

Also, the timing control module 810, or the condition control module 820, or both may be a software module or a hardware module which is included in a memory interface 420 or is executed or operated by the memory interface 420.

While the memory device 110 performs a cell operation such as the data program operation DATA_PGM, the data read operation DATA_READ, or the data erase operation DATA_ER, the status signal SS has the first level voltage LV1., While the memory device 110 performs no operation or while the memory device 110 does not perform any of the cell operations DATA_PGM, DATA_READ, and DATA_ER and performs the input/output operation DATA_IN or DATA_OUT, the status signal SS has the second level voltage LV2.

While the data read operation DATA_READ is performed, the status signal SS has the first level voltage LV1. If the data read operation DATA_READ is complete, the status signal SS is changed from the first level voltage LV1 to the second level voltage LV2. If the status signal SS is changed from the first level voltage LV1 to the second level voltage LV2, the timing control module 810 of the memory controller 120 may output the pre-resume command PRE-RESUME to the memory device 110. That is to say, if the status signal SS is changed from the first level voltage LV1 to the second level voltage LV2 after the data read operation DATA_READ is performed in the memory device 110 in response to the read command READ, the memory controller 120 may output the pre-resume command PRE-RESUME to the memory device 110.

A first period in which the status signal SS has the first level voltage LV1 may be referred to as a busy period in which the memory device 110 is busy with the cell operation, and a second period in which the status signal SS has the second level voltage LV2 may be referred to as a ready period in which the memory device 110 gets ready for the cell operation. In this sense, the status signal SS may also be referred to as a ready and busy signal.

Before the read data is outputted from the page buffer circuit 230 to the outside of the memory device 110 after the data read operation DATA_READ has been completed, the condition control module 820 of the memory controller 120 may determine whether the memory device 110 is in a state that satisfies a predefined pre-resume condition. Specifically, the condition control module 820 of the memory controller 120 may determine whether a pre-resume condition is satisfied during a time interval between a first time at which the data read operation DATA_READ has been completed and a second time at which the page buffer circuit 230 starts to output the read data to the outside of the memory device 110.

A state in which the memory device 110 satisfies the predefined pre-resume condition may be a state in which the memory device 110 may perform the parallel processing or a state in which the memory device 110 requires the parallel processing.

When it is determined that the memory device 110 is in a state that satisfies the pre-resume condition, the condition control module 820 of the memory controller 120 may output the pre-resume command PRE-RESUME to the memory device 110.

When it is determined that the memory device 110 is not in a state that satisfies the pre-resume condition, the condition control module 820 of the memory controller 120 may directly output the data output command D/O to the memory device 110 without outputting the pre-resume command PRE-RESUME.

In the case where it is determined that the memory device 110 is not in a state that satisfies the pre-resume condition and thus the memory controller 120 directly outputs the data output command D/O to the memory device 110 without outputting the pre-resume command PRE-RESUME, after the memory controller 120 receives all read data from the memory device 110 according to the output of the data output command D/O (that is, after the data read operation DATA_READ is complete), the memory controller 120 may output, to the memory device 110, a resume command which commands the data program operation DATA_PGM or the data erase operation DATA_ER suspended by the suspend command SUSPEND, to be resumed.

For example, in the case where the read command READ is a last read command READ or in the case where a read count is limited, the condition control module 820 of the memory controller 120 may determine that the memory device 110 is in a state that satisfies the pre-resume condition. In this regard, for example, a read count may be limited by a firmware policy or may be limited due to degradation in the reliability of the memory device 110.

For another example, in the case where there is no read command READ to be processed after the suspend command SUSPEND is outputted or in the case where a read count is equal to or greater than a threshold value after the suspend command SUSPEND is outputted, the condition control module 820 of the memory controller 120 may determine that the memory device 110 is in a state that satisfies the pre-resume condition.

For still another example, in the case where no read command READ exists in a queue in which commands are queued, the condition control module 820 of the memory controller 120 may determine that the memory device 110 is in a state that satisfies the pre-resume condition.

The case where the read command READ is a last read command READ, the case where a read count is limited, the case where there is no read command READ to be processed, and the case where a read count is equal to or greater than the threshold value may each correspond to a situation where additional reading is not required or no reading needs to be performed. Therefore, for the above cases, the pre-resume processing may be performed.

For yet another example, in the case where the size of read data is equal to or larger than a threshold size, the condition control module 820 of the memory controller 120 may determine that the memory device 110 is in a state that satisfies the pre-resume condition.

The case where the size of read data is equal to or larger than the threshold size corresponds to a case where the pre-resume based parallel processing technique facilitates the improvement in quality (quick processing).

The above-described parallel processing may be performed by being accompanied with the pre-resume processing. In response to the pre-resume command PRE-RESUME, the memory device 110 resumes the data program operation DATA_PGM or the data erase operation DATA_ER that is suspended by the suspend command SUSPEND, and performs the data output operation DATA_OUT in parallel with the resumed data program operation DATA_PGM or data erase operation DATA_ER.

Similarly to the case where the suspend and resume technique is used as described above, in the case where the pre-resume based parallel processing technique is used, if a time interval elapsed after outputting the suspend command SUSPEND is equal to or longer than a given time interval (e.g., a predetermined threshold time interval), the condition control module 820 of the memory controller 120 may determine that the memory device 110 is in a state that satisfies the pre-resume condition.

In the case where a time interval elapsed after outputting the suspend command SUSPEND is equal to or longer than the predetermined threshold time interval, program quality or erase quality may be markedly degraded by the suspension of the data program operation DATA_PGM or the data erase operation DATA_ER. The threshold time interval may be determined to be sufficiently short to keep program quality or erase quality equal to or greater than a given level. Therefore, it is possible to substantially prevent the degradation in program quality or erase quality through the pre-resume processing.

In the case where the parallel processing technique and the suspend and resume technique are applied together, the memory system 100 may operate as follows.

If the memory controller 120 receives a read request from the host while the memory device 110 performs the data program operation DATA_PGM or the data erase operation DATA_ER, the memory controller 120 outputs the suspend command SUSPEND to the memory device 110, and outputs the read command READ to the memory device 110.

Accordingly, the memory device 110 suspends the data program operation DATA_PGM or the data erase operation DATA_ER that is being performed, in response to the suspend command SUSPEND, and starts the data read operation DATA_READ.

If the data read operation DATA_READ is performed and complete, before or after receiving the pre-resume command PRE-RESUME, the control logic 220 of the memory device 110 may cache the read data stored in the read buffer READ_BUF in a cache, and, as the data output command D/O is inputted, may output the read data cached in the cache to the outside through the data input/output circuit 260. Specifically, after the date read operation DATA_READ is complete, the control logic 220 of the memory device 110 may transfer the read data from the read buffer READ_BUF to a cache and store the transferred data in the cache before or after receiving the pre-resume command PRE-RESUME. Subsequently, the control logic 220 may output the stored data in the cache in response to the data output command D/O to the outside of the memory device 110 through the data input/output circuit 260. The read buffer READ_BUF and the cache may be separately provided in the page buffer circuit 230, or, the read buffer READ_BUF may play the role of the cache.

Before the data output operation DATA_OUT is started after the data read operation DATA_READ is complete in the memory device 110, the memory controller 120 provides the pre-resume command PRE-RESUME to the memory device 110.

Accordingly, in response to the pre-resume command PRE-RESUME, the memory device 110 resumes the data program operation DATA_PGM or the data erase operation DATA_ER that is suspended by the suspend command SUSPEND, and performs the data output operation DATA_OUT in parallel with the resumed data program operation DATA_PGM or data erase operation DATA_ER.

The pre-resume based parallel processing in accordance with embodiments of the disclosure may be performed independently in each memory die.

Figure 10:
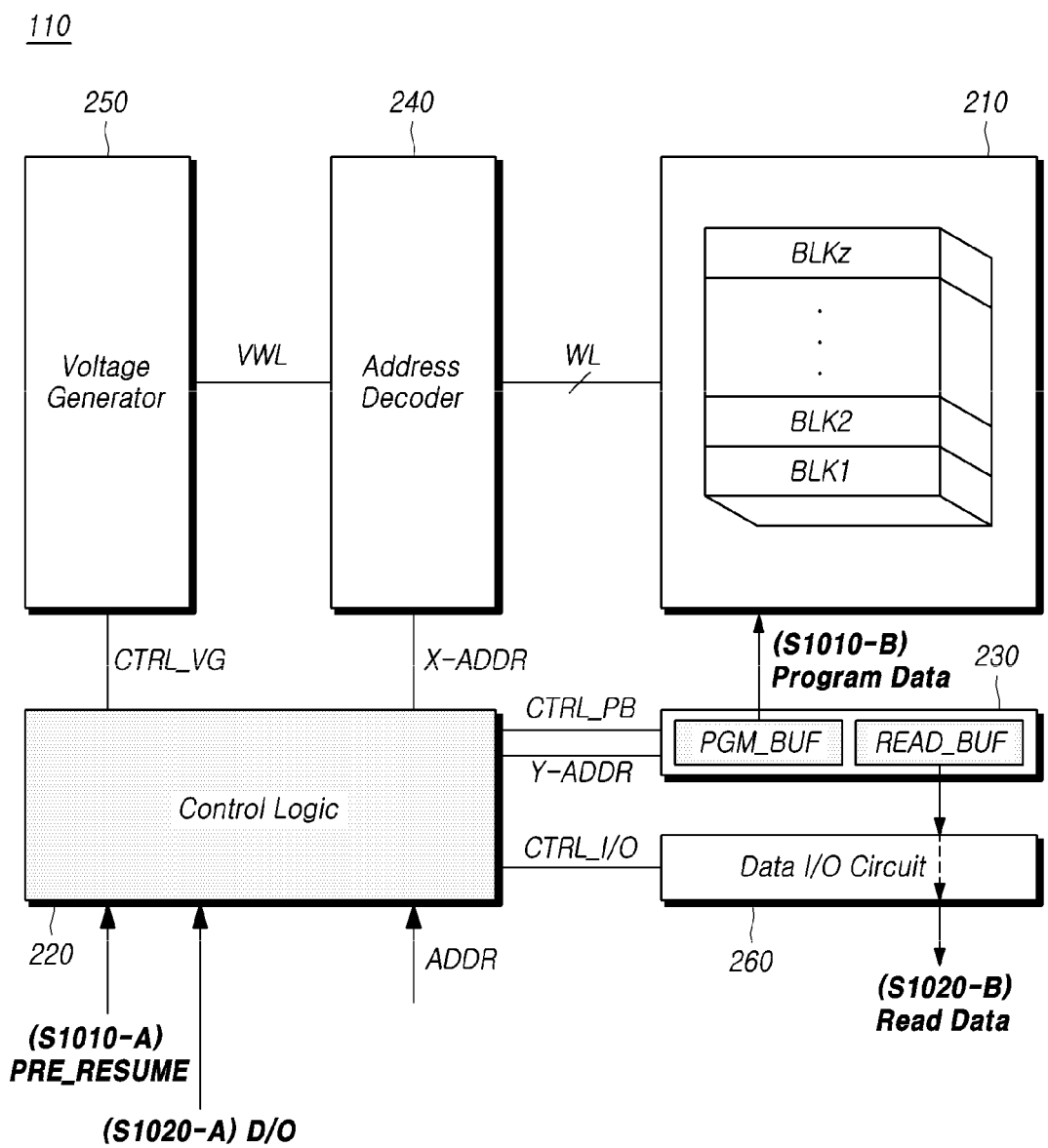

FIGS. 9(a), 9(b), and 10 are diagrams to illustrate the pre-resume based parallel processing technique to improve both read quality and program quality in the case where a data read process is started after a data program process has been started, in the memory system 100 in accordance with embodiments of the disclosure.

Referring to FIG. 9(a), in the case where a read request READ REQ is generated from the host at a time point when the data input operation DATA_IN for the data program process is complete or while the data input operation DATA_IN is performed, the memory controller 120 provides the suspend command SUSPEND to the memory device 110, and then, provides the read command READ to the memory device 110. Accordingly, the memory device 110 suspends the start of the data program operation DATA_PGM, and performs the data read operation DATA_READ.

Referring to FIG. 9(b), in the case where a read request READ REQ is generated from the host while the data program operation DATA_PGM is performed after the data input operation DATA_IN for the data program process has been completed, the memory controller 120 provides the suspend command SUSPEND to the memory device 110, and then, provides the read command READ to the memory device 110. Accordingly, the memory device 110 suspends the data program operation DATA_PGM, and performs the data read operation DATA_READ.

Referring to FIGS. 9(a) and 9(b), when it is checked that the data read operation DATA_READ is complete in the memory device 110, the memory controller 120 outputs the pre-resume command PRE-RESUME to the memory device 110. Accordingly, the memory device 110 resumes the data program operation DATA_PGM that is suspended before or after being started, and performs the data output operation DATA_OUT in parallel with the resumed data program operation DATA_PGM.

Referring to FIG. 10, in response to the pre-resume command PRE-RESUME inputted at S1010-A, the control logic 220 of the memory device 110 resumes the suspended data program operation DATA_PGM, and thereby, programs the program data stored in the program buffer PGM_BUF to the memory cell array 210 at S1010-B. While the data program operation DATA_PGM that has been resumed in response to the pre-resume command PRE-RESUME is performed, if the data output command D/O is inputted at S1020-A, the control logic 220 of the memory device 110 may perform the data output operation DATA_OUT, and thereby, may output the read data stored in the read buffer READ_BUF, to the outside of the memory device 110 (e.g., the memory controller 120) through the data input/output circuit 260 at S1020-B. At this time, the program data stored in the program buffer PGM_BUF may be being programmed to the memory cell array 210 by the data program operation DATA_PGM at S1010-B.

While performing the data program operation DATA_PGM to program the program data stored in the program buffer PGM_BUF that is in an activated state to the memory cell array 210, if the suspend command SUSPEND is received, the memory device 110 suspends the data program operation DATA_PGM. Accordingly, the program buffer PGM_BUF becomes a deactivated state.

When the read command READ is received, the memory device 110 performs the data read operation DATA_READ of storing the read data read from the memory cell array 210 in the read buffer READ_BUF.

If the pre-resume command PRE-RESUME is received, the memory device 110 may resume the data program operation DATA_PGM as the program buffer PGM_BUF becomes the activated state, and may perform the data output operation DATA_OUT as the read buffer READ_BUF is maintained in or changed to the activated state. In other words, while the pre-resume based parallel processing is performed, the program buffer PGM_BUF and the read buffer READ_BUF may substantially simultaneously be in the activated state.

Referring to FIG. 10, when the parallel processing technique is utilized, the page buffer circuit 230 may output data (e.g., program data) in the direction of an internal cell, and at substantially the same time, may output data (e.g., read data) to the outside of the memory device 110.

Figure 11:
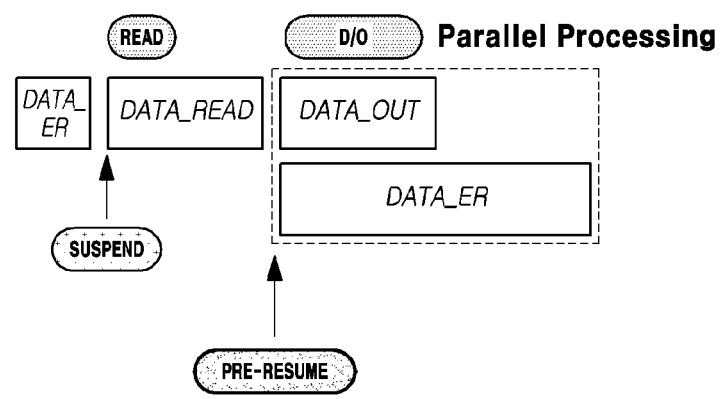
FIGS. 11 and 12 illustrate a pre-resume based parallel processing technique to improve both read quality and erase quality in the case where a data read process is started after a data erase process has been started, in a memory system in accordance with embodiments of the disclosure.
Figure 12:
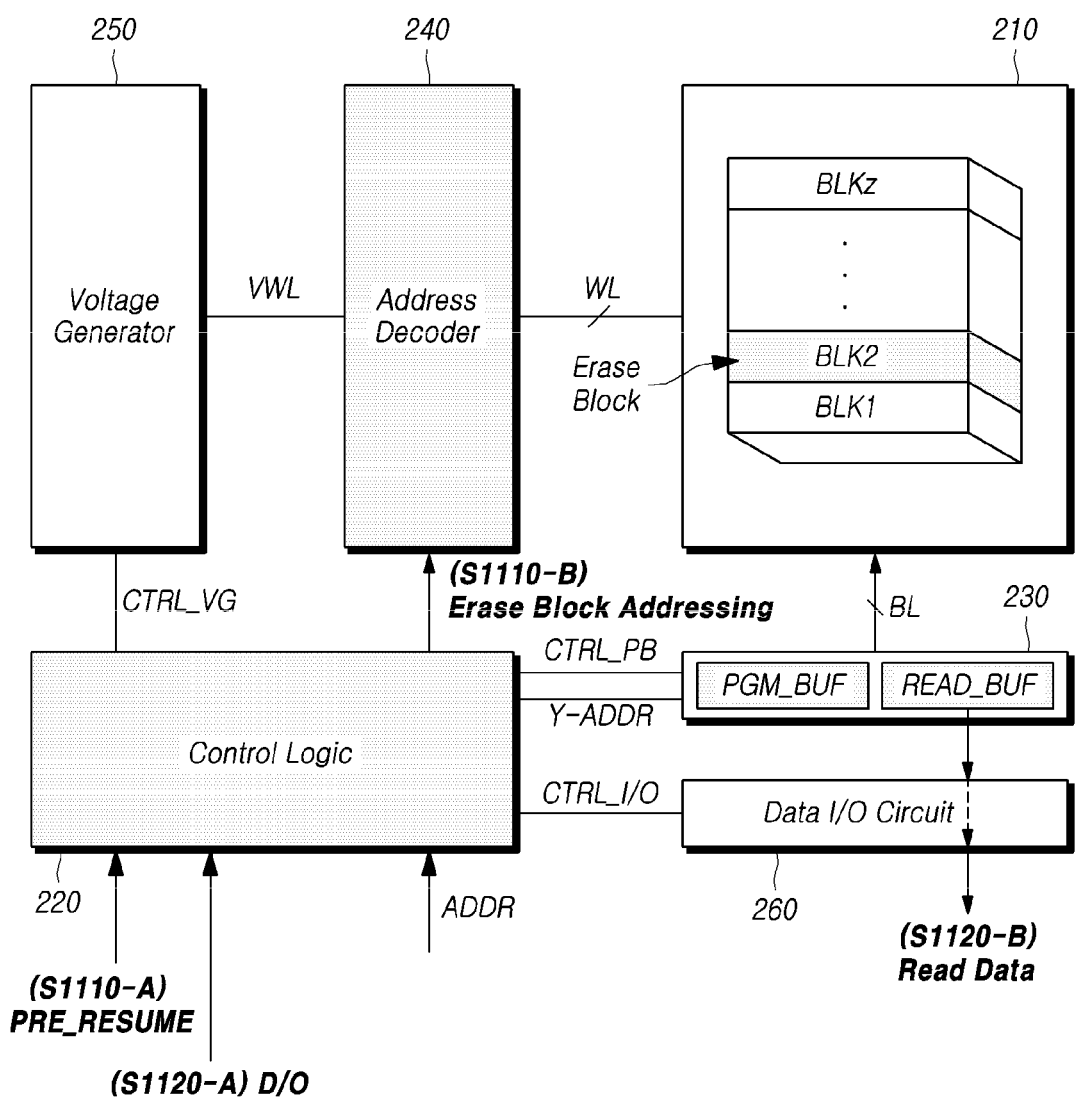

FIGS. 11 and 12 are diagrams to illustrate the pre-resume based parallel processing technique to improve both read quality and erase quality in the case where a data read process is started after a data erase process has been started, in a memory system (e.g., the memory system 100 of FIG. 8) in accordance with embodiments of the disclosure.

Referring to FIG. 11, in the case where a read request READ REQ is generated from the host while the data erase operation DATA_ER for the data erase process is performed, the memory controller 120 provides the suspend command SUSPEND to the memory device 110, and then, provides the read command READ to the memory device 110. Accordingly, the memory device 110 suspends the data erase operation DATA_ER, and performs the data read operation DATA_READ.

Referring to FIG. 11, when it is checked that the data read operation DATA_READ is complete in the memory device 110, the memory controller 120 may output the pre-resume command PRE-RESUME to the memory device 110, and then, may output the data output command D/O. Accordingly, the memory device 110 resumes the suspended data erase operation DATA_ER, and performs the data output operation DATA_OUT in parallel with the resumed data erase operation DATA_ER.

More specifically, referring to FIG. 12, if the pre-resume command PRE-RESUME is inputted at S1110-A, the control logic 220 of the memory device 110 may perform block addressing for a memory block (e.g., a second block BLK2) to be erased, by using the address decoder 240, to resume the suspended data erase operation DATA_ER at S1110-B. If the data output command D/O is inputted at S1120-A while the data erase operation DATA_ER is resumed and performed, the control logic 220 of the memory device 110 may perform the data output operation DATA_OUT, and thereby, may output the read data stored in the read buffer READ_BUF, to the outside (e.g., the memory controller 120) through the data input/output circuit 260 at S1120-B. At this time, data may be being erased in the corresponding memory block BLK2 by the resumed data erase operation DATA_ER.

Referring to FIG. 12, while the read data stored in the read buffer READ_BUF is outputted to the outside of the memory device 110, data programmed to the memory cell array 210 may be erased in response to the pre-resume command PRE-RESUME.

As described above, in the case where the suspend and resume technique and the parallel processing technique are applied together, the pre-resume command PRE-RESUME basically serves as a fast resume command which resumes the suspended data program operation DATA_PGM or data erase operation DATA_ER at an early timing. The early timing may be a timing before the data output operation DATA_OUT is started.

If the pre-resume command PRE-RESUME serves as the fast resume command and does not serve as the data output command D/O, the memory controller 120 may output the data output command D/O after outputting the pre-resume command PRE-RESUME.

If the pre-resume command PRE-RESUME serves as the fast resume command and also serves as the data output command D/O, the memory controller 120 may not output the data output command D/O after outputting the pre-resume command PRE-RESUME.

Figure 13:
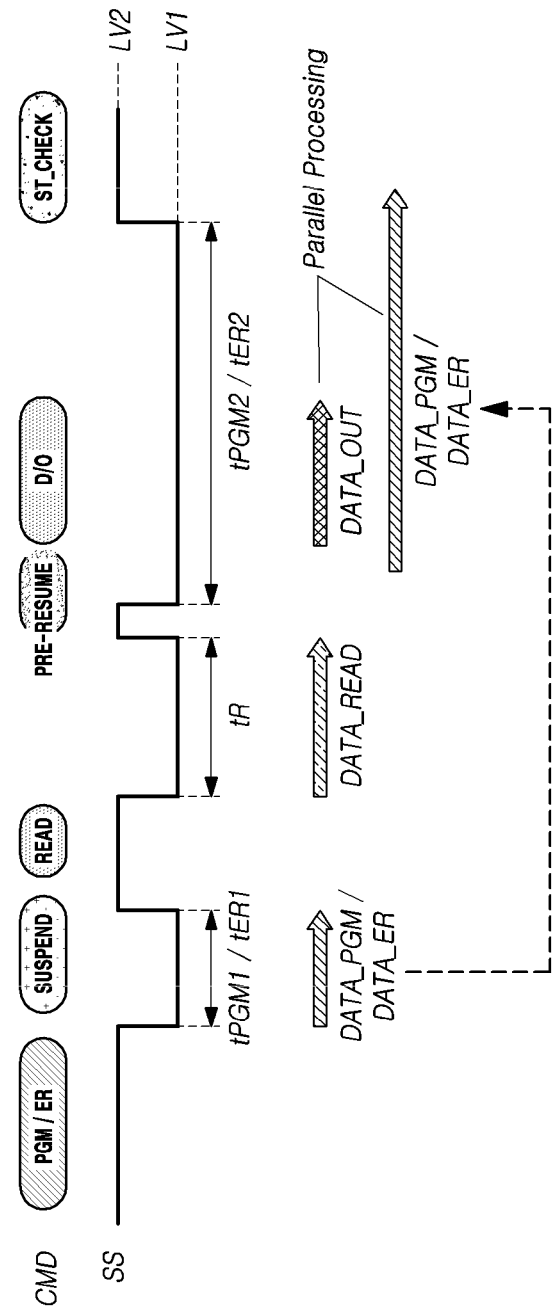
FIG. 13 is an operation timing diagram and FIGS. 14A and 14B are flow charts, when a data read process is started after a data program process or a data erase process has been started, in the case of using a pre-resume based parallel processing technique, in a memory system in accordance with embodiments of the disclosure.
Figure 14A:
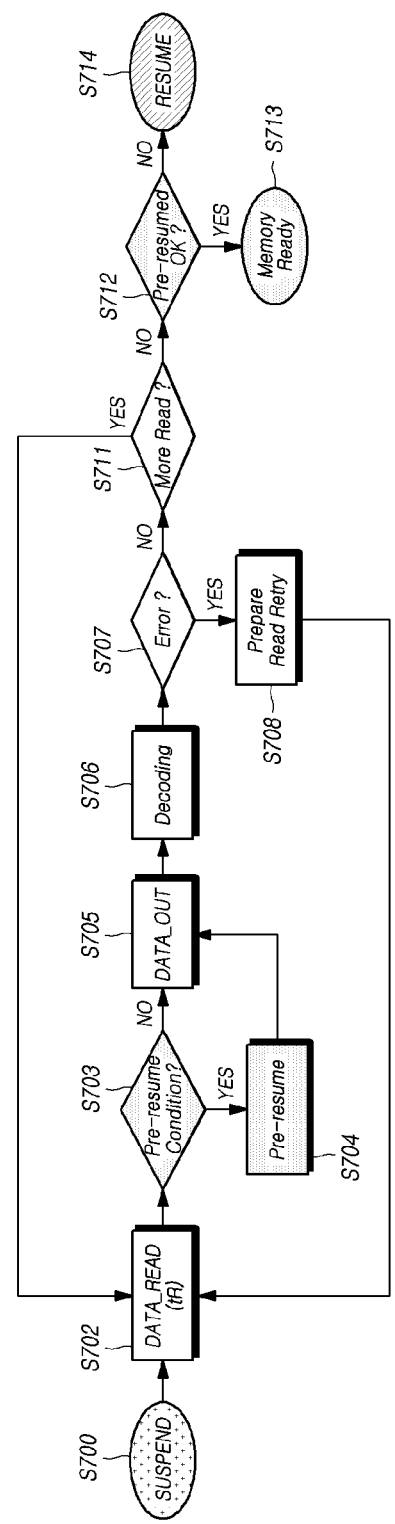
Figure 14B:
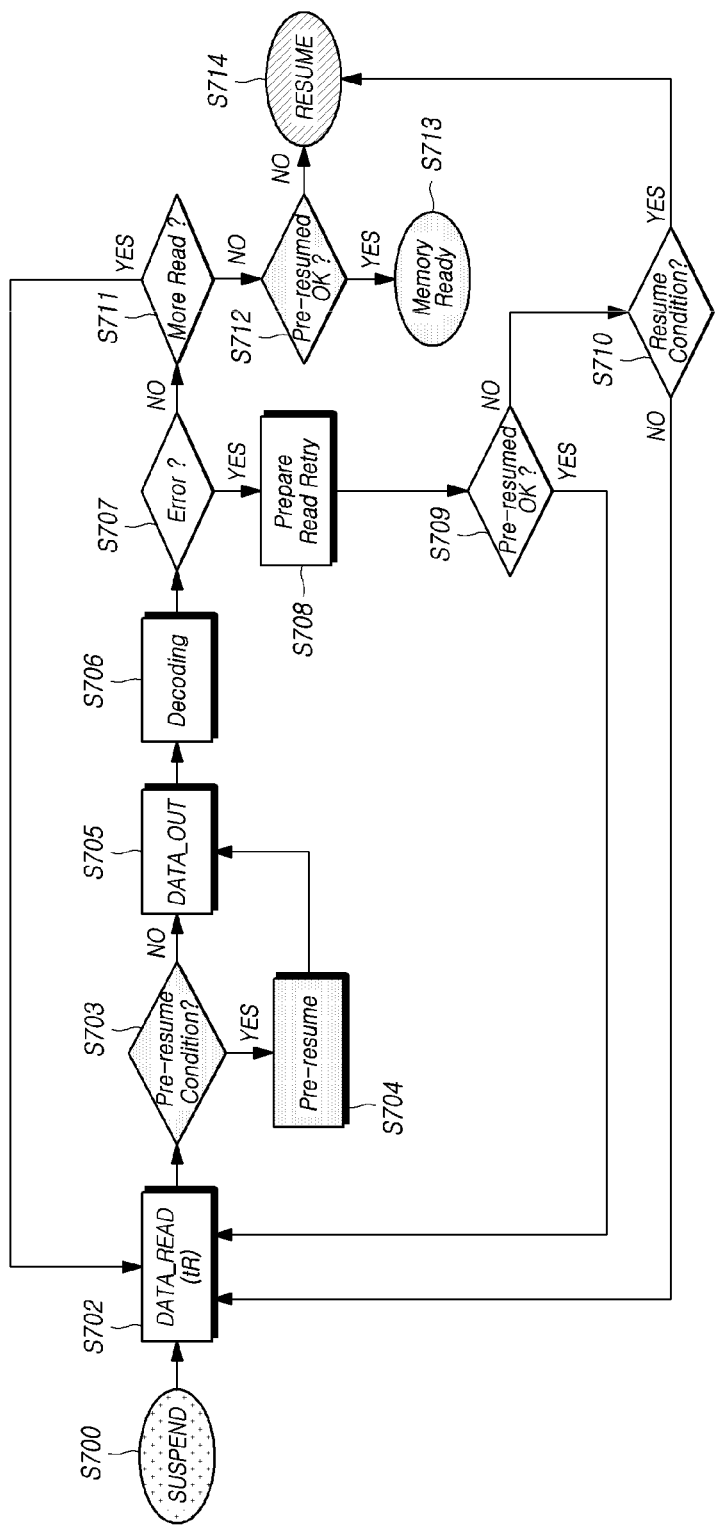

FIG. 13 is an operation timing diagram and FIGS. 14A and 14B are flow charts, when the data read process is started after the data program process or the data erase process has been started, in the case of using the pre-resume based parallel processing technique, in the memory system 100 in accordance with embodiments of the disclosure.

Referring to FIG. 13, the memory controller 120 outputs the program command PGM or the erase command ER to the memory device 110.

Referring to FIG. 13, the memory controller 120 outputs, to the memory device 110, the suspend command SUSPEND which suspends the data program operation DATA_PGM that is being performed for the first program time interval tPGM1 in the memory device 110 by the program command PGM or the data erase operation DATA_ER that is being performed for the first erase time interval tER1 in the memory device 110 by the erase command ER. The memory controller 120 outputs the read command READ to the memory device 110 after outputting the suspend command SUSPEND.

Referring to FIG. 13, if the read data read from the memory cell array 210 in the memory device 110 by the read command READ is stored in the page buffer circuit 230, that is, if the data read operation DATA_READ for the read time interval tR is complete, the memory controller 120 outputs the pre-resume command PRE-RESUME to the memory device 110. The memory controller 120 may additionally output the data output command D/O to the memory device 110, after outputting the pre-resume command PRE-RESUME to the memory device 110.

Accordingly, in response to the pre-resume command PRE-RESUME, the memory device 110 may resume the data program operation DATA_PGM suspended by the suspend command SUSPEND and perform the data program operation DATA_PGM for the second program time interval tPGM2 or resume the data erase operation DATA_ER suspended by the suspend command SUSPEND and perform the data erase operation DATA_ER for the second erase time interval tER2, and may perform the data output operation DATA_OUT of outputting the read data stored in the page buffer circuit 230, in parallel with the data program operation DATA_PGM or the data erase operation DATA_ER.

Referring to FIG. 13, the memory controller 120 outputs the status check command ST_CHECK to the memory device 110, and thereby, checks whether the data program operation DATA_PGM or the data erase operation DATA_ER is normally completed in the memory device 110.

Referring to FIG. 13, the memory device 110 may output the status signal SS having the first level voltage LV1 and the second level voltage LV2 that are different from each other and alternate with each other, through the status signal output pin 800. For example, the first level voltage LV1 may be a low level voltage, and the second level voltage LV2 may be a high level voltage. For another example, the first level voltage LV1 may be a high level voltage, and the second level voltage LV2 may be a low level voltage.

Referring to FIG. 13, a first period in which the status signal SS has the first level voltage LV1 corresponds to a period in which the memory device 110 performs a cell operation such as the data program operation DATA_PGM, the data read operation DATA_READ, or the data erase operation DATA_ER. A second period in which the status signal SS has the second level voltage LV2 corresponds to a period in which the memory device 110 performs no operation or the memory device 110 does not perform the cell operation DATA_PGM, DATA_READ, or DATA_ER. During the period in which the status signal SS has the second level voltage LV2, the data input operation DATA_IN and/or the data output operation DATA_OUT may be performed.

Referring to FIG. 13, the memory controller 120 may check an operation status of the memory device 110 based on the status signal SS outputted from the memory device 110.

The pre-resume command PRE-RESUME in accordance with embodiments of the disclosure basically serves as a fast resume command which resumes the suspended data program operation DATA_PGM or data erase operation DATA_ER at an early timing. The early timing may be a timing before the data output operation DATA_OUT is started.

Referring to FIGS. 14A and 14B, if the memory device 110 receives the suspend command SUSPEND from the memory controller 120 while performing the data program operation DATA_PGM for the first program time interval tPGM1 in response to the program command PGM or performing the data erase operation DATA_ER for the first erase time interval tER1 in response to the erase command ER, at S700, the memory device 110 suspends the data program operation DATA_PGM or the data erase operation DATA_ER that is being performed.

Referring to FIGS. 14A and 14B, when receiving the read request READ REQ from the host, the memory controller 120 may output the suspend command SUSPEND to the memory device 110 at S700. Further, the memory controller 120 outputs the read command READ to the memory device 110. Accordingly, the memory device 110 suspends the data program operation DATA_PGM or the data erase operation DATA_ER that is being performed, in response to the suspend command SUSPEND, and starts the data read operation DATA_READ at S702.

Referring to FIGS. 14A and 14B, the memory device 110 performs the data read operation DATA_READ for the read time interval tR at S702, and, when the data read operation DATA_READ has been completed, the memory device 110 changes the output voltage of the status signal SS from the first level voltage LV1 to the second level voltage LV2.

The memory controller 120 may confirm that the data read operation DATA_READ has been completed, through the voltage change from the first level voltage LV1 to the second level voltage LV2 of the status signal SS outputted from the memory device 110.

Referring to FIGS. 14A and 14B, when confirming that the data read operation DATA_READ has been completed, the memory controller 120 determines whether the memory device 110 in a state that satisfies the predefined pre-resume condition at S703.

Referring to FIGS. 14A and 14B, when it is determined as a result of the determination at S703 that the memory device 110 is not in a state that satisfies the predefined pre-resume condition, the memory controller 120 outputs the data output command D/O to the memory device 110. The memory device 110 performs the data output operation DATA_OUT in response to the data output command D/O at S705.

Referring to FIGS. 14A and 14B, when it is determined as a result of the determination at S703 that the memory device 110 is in a state that satisfies the predefined pre-resume condition, the memory controller 120 provides the pre-resume command PRE-RESUME to the memory device 110 at S704.

Accordingly, in response to the pre-resume command PRE-RESUME, the memory device 110 resumes the data program operation DATA_PGM or the data erase operation DATA_ER that has been suspended by the suspend command SUSPEND at S700, and thereby, performs the data program operation DATA_PGM for the second program time interval tPGM2 or performs the data erase operation DATA_ER for the second erase time interval tER2.

Referring to FIGS. 14A and 14B, the memory controller 120 may output the data output command D/O after outputting the pre-resume command PRE-RESUME to the memory device 110, and the memory device 110 may perform the data output operation DATA_OUT in response to the data output command D/O at S705.

After S703 or S704, when the data output operation DATA_OUT is performed in the memory device 110 at S705, the read data stored in the read buffer READ_BUF is outputted to the outside (e.g., the memory controller 120) of the memory device 110. As illustrated in FIG. 13, while the data output operation DATA_OUT is performed in the memory device 110 at S705, the status signal SS outputted from the memory device 110 has the second level voltage LV2.

Referring to FIGS. 14A and 14B, after the data output operation DATA_OUT is performed in the memory device 110 at S705, S706 at which the memory controller 120 decodes data received through the data output operation DATA_OUT of the memory device 110, and S707 at which the memory controller 120 checks whether the decoded data has an error may be additionally performed.

Referring to FIGS. 14A and 14B, in the case where it is checked as a result of the checking at S707 that there is no error, the memory controller 120 checks whether there is another read command at S711.

Referring to FIGS. 14A and 14B, if it is checked as a result of the checking at S711 that there is another read command, the memory controller 120 performs another data read operation DATA_READ at S702. If it is checked as a result of the checking at S711 that there is no more read command after the suspend command SUSPEND, the memory controller 120 determines whether pre-resume processing has ever been performed at S712. If it is determined as a result of the determination at S712 that no pre-resume processing has ever been performed, the memory controller 120 outputs the resume command RESUME to the memory device 110 at S714. If it is determined as a result of the determination at S712 that pre-resume processing has ever been performed, the memory controller 120 controls the memory device 110 to wait in a ready state at S713.

Referring to FIG. 14A, in the case where it is checked as a result of the checking at S707 that there is an error, the memory controller 120 prepares a read retry at S708, and, when the preparation is completed, performs the data read operation DATA_READ again at S702.

Alternatively, referring to FIG. 14B, when it is checked as a result of checking at S707 that there is an error, the memory controller 120 prepares a read retry at S708) and, when the preparation of the read retry is complete, the memory controller 120 determines whether the data program operation DATA_PGM or the data erase operation DATA_ER, which is suspended as the pre-resume command PRE-RESUME is already outputted, has already been resumed and is being performed or is completely performed at S709. For example, at S709, the memory controller 120 may determine whether the suspended data program operation DATA_PGM or the suspended data erase operation DATA_ER has been resumed in response to the pre-resume command PRE-RESUME, and if so, the memory controller 120 may determine whether the resumed data program operation DATA_PGM or the resumed data erase operation DATA_ER is being performed or is complete.

Referring to FIG. 14B, if it is determined as a result of the determination at S709 that pre-resume processing is being performed or has already been completed, the memory controller 120 performs the data read operation DATA_READ again at S702. However, if it is determined as a result of the determination at S709 that no pre-resume processing has ever been performed, the memory controller 120 determines whether a resume condition is satisfied at S710.

Referring to FIG. 14B, if it is determined as a result of the determination at S710 that the resume condition is not satisfied, the memory controller 120 performs the read retry at S702. If it is determined as a result of the determination at S710 that the resume condition is satisfied, the memory controller 120 outputs the resume command RESUME to the memory device 110 at S714.

The resume condition mentioned above may be determined as being satisfied, for example, in the case where a read count is limited or in the case where a time interval for which the data program operation DATA_PGM or the data erase operation DATA_ER is suspended by the suspend command SUSPEND is equal to or longer than a predetermined threshold time interval. For example, a read count may be limited by a firmware policy or due to degradation in the reliability of the memory device 110.

Referring to FIG. 14B, if the data read process such as the data output operation DATA_OUT and the like, including S702, S705, S706, S707, S708, and S711, is completely performed in the memory device 110 or it is determined at S710 that the resume condition is satisfied, the memory controller 120 outputs the resume command RESUME to the memory device 110 at S714.

FIG. 15(a) illustrates a case of using the suspend and resume technique and FIG. 15(b) illustrates a case of using the pre-resume based parallel processing technique, in the memory system 100 in accordance with an embodiment of the disclosure.

Referring to FIG. 15(a), if only the suspend and resume technique is applied without parallel processing, the read quality may be improved due to relatively quick completion of the data read process. However, because the data program process or the data erase process is resumed after being suspended by the read process, the program quality (or write quality) or the erase quality may be degraded.

Referring to FIG. 15(b), in the case where the pre-resume based parallel processing technique is used, the read quality may be maintained at the substantially same level as that in FIG. 15(a), because the data read process of FIG. 15(b) is complete substantially at the same time as the data read process of FIG. 15(a).

In the case of using the pre-resume based parallel processing technique, even though the data program process is suspended by the data read process, because the suspended data program process is fast resumed (indicated by "Fast Resume" in FIG. 15(b)) by the pre-resume command PRE-RESUME before the data output operation DATA_OUT is started after the data read operation DATA_READ has been completed, the data program process or the data erase process may be complete considerably faster (indicated by "Fast Program/Fast Erase" in FIG. 15(b)) than that in FIG. 15(a). Therefore, in the case of using the pre-resume based parallel processing technique, the program quality (write quality) or the erase quality may be further improved.

Hereinafter, the above-described memory device 110 and memory controller 120 in accordance with embodiments of the disclosure will be briefly described again.

The memory device 110 in accordance with embodiments of the disclosure may include the memory cell array 210 which includes the plurality of memory cells MC, the control logic 220 which performs the data read operation DATA_READ of reading read data from the memory cell array 210 in response to the read command READ, the page buffer circuit 230 which stores the read data read from the memory cell array 210 as the data read operation DATA_READ is performed, and the data input/output circuit 260 which outputs the read data stored in the page buffer circuit 230 to the outside.

After the data read operation DATA_READ has been completed, before the read data stored in the page buffer circuit 230 is outputted to the outside through the data input/output circuit 260, the control logic 220 may receive the pre-resume command PRE-RESUME.

In response to the received pre-resume command PRE-RESUME, the control logic 220 may perform the data program operation DATA_PGM to the memory cell array 210 or perform the data erase operation DATA_ER in the memory cell array 210, and may perform the data output operation DATA_OUT of outputting the read data stored in the page buffer circuit 230 to the outside through the data input/output circuit 260, in parallel with the data program operation DATA_PGM or the data erase operation DATA_ER.

The page buffer circuit 230 of the memory device 110 may include the read buffer READ_BUF and the program buffer PGM_BUF.

When the control logic 220 of the memory device 110 receives the pre-resume command PRE-RESUME, the data program operation DATA_PGM of programming the program data stored in the program buffer PGM_BUF to the memory cell array 210 and the data output operation DATA_OUT of outputting the read data stored in the read buffer READ_BUF to the outside may be performed in parallel.

Before receiving the read command READ, the control logic 220 may receive the suspend command SUSPEND which commands the data program operation DATA_PGM or the data erase operation DATA_ER that is already being performed, to be suspended.

The data program operation DATA_PGM or the data erase operation DATA_ER performed after the pre-resume command PRE-RESUME is received may be the data program operation DATA_PGM or the data erase operation DATA_ER that has been suspended by the suspend command SUSPEND and is then resumed by the pre-resume command PRE-RESUME.

The memory device 110 may further include the status signal output pin 800 which outputs the status signal SS having the first level voltage LV1 and the second level voltage LV2 that are different from each other and alternate with each other.

While the data read operation DATA_READ is performed, the status signal SS may have the first level voltage LV1, and, if the data read operation DATA_READ is complete, the status signal SS may be changed from the first level voltage LV1 to the second level voltage LV2.

After the data read operation DATA_READ is performed, if the status signal SS outputted from the status signal output pin 800 is changed from the first level voltage LV1 to the second level voltage LV2, the control logic 220 of the memory device 110 may receive the pre-resume command PRE-RESUME.

The memory device 110 in accordance with embodiments of the disclosure may include the memory cell array 210 which includes the plurality of memory cells MC, the control logic 220 which reads read data from the memory cell array 210 or programs program data to the memory cell array 210, and the page buffer circuit 230 including the read buffer READ_BUF in which the read data read from the memory cell array 210 is stored and the program buffer PGM_BUF in which the program data to be programmed to the memory cell array 210 is stored.

While the read data stored in the read buffer READ_BUF is outputted to the outside, the program data stored in the program buffer PGM_BUF may be programmed to the memory cell array 210.

The memory controller 120 in accordance with embodiments of the disclosure may include the memory interface 420 for communicating with the memory device 110 including the memory cell array 210 and the page buffer circuit 230. The memory controller 120 may further include the control circuit 430 which outputs the read command READ to the memory device 110 and outputs, to the memory device 110, the pre-resume command PRE-RESUME commanding the memory device 110 to perform different kinds of operations in parallel, after the read data read from the memory cell array 210 in the memory device 110 in response to the read command READ is stored in the page buffer circuit 230 in the memory device 110 and before the read data stored in the page buffer circuit 230 is outputted to the outside of the memory device 110.

The different kinds of operations may include one cell operation (e.g., the data program operation DATA_PGM in which the memory device 110 programs data to the memory cell array 210, or the data erase operation DATA_ER in which the memory device 110 erases data in the memory cell array 210) and the data output operation DATA_OUT in which the memory device 110 outputs the read data stored in the page buffer circuit 230 to the outside of the memory device 110.

Before outputting the read command READ, the control circuit 430 of the memory controller 120 may output the suspend command SUSPEND which commands the memory device 110 to suspend the data program operation DATA_PGM or the data erase operation DATA_ER that is being performed.

The data program operation DATA_PGM or the data erase operation DATA_ER that the memory device 110 performs in response to the pre-resume command PRE-RESUME may be the data program operation DATA_PGM or the data erase operation DATA_ER that has been suspended by the suspend command SUSPEND and is then resumed by the pre-resume command PRE-RESUME.

After the read data is stored in the page buffer circuit 230 and before the read data is outputted from the page buffer circuit 230 (that is, after the data read operation DATA_READ has been completed and before the data output operation DATA_OUT is started), the control circuit 430 of the memory controller 120 may determine whether the memory device 110 is in a state that satisfies the predefined pre-resume condition.

When it is determined as a result of the determination that the memory device 110 is in a state that satisfies the pre-resume condition, the control circuit 430 may output the pre-resume command PRE-RESUME to the memory device 110.

When it is determined as a result of the determination that the memory device 110 is not in a state that satisfies the pre-resume condition, the control circuit 430 may directly output the data output command D/O to the memory device 110 without outputting the pre-resume command PRE-RESUME.

The control circuit 430 may determine an output timing of the pre-resume command PRE-RESUME, based on the status signal SS which is outputted from the memory device 110 and has the first level voltage LV1 and the second level voltage LV2 that are different from each other and alternate with each other.

While the data read operation DATA_READ is performed in the memory device 110 in response to the read command READ, the status signal SS may have the first level voltage LV1, and, if the data read operation DATA_READ is complete in the memory device 110, the status signal SS may be changed from the first level voltage LV1 to the second level voltage LV2.

If the status signal SS is changed from the first level voltage LV1 to the second level voltage LV2, the control circuit 430 may output the pre-resume command PRE-RESUME.

Figure 16:
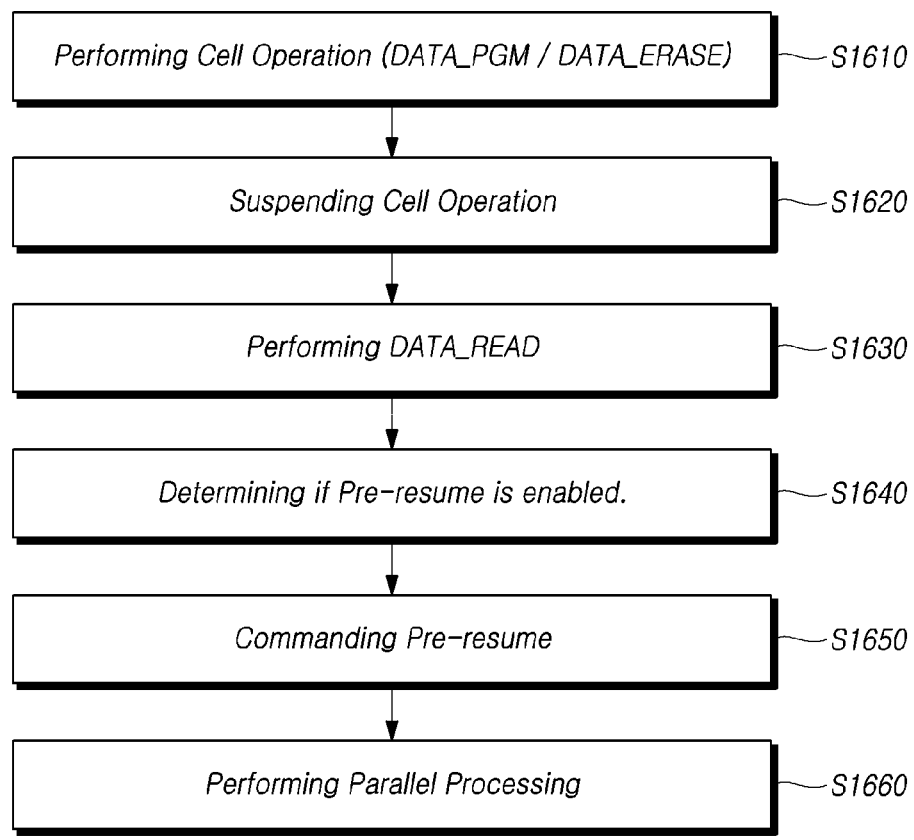
FIG. 16 is a flow chart illustrating a method for operating a memory system in accordance with an embodiment of the disclosure.

FIG. 16 is a flow chart illustrating a method for operating the memory system 100 in accordance with an embodiment of the disclosure.

Referring to FIG. 16, the method for operating the memory system 100 may include data read step S1630, pre-resume command step S1650, and parallel processing step S1660.

In the data read step S1630, the memory device 110 stores read data read from the memory cell array 210 in the page buffer circuit 230 in response to the read command READ.

In the pre-resume command step S1650, after the read data is stored in the page buffer circuit 230 by the data read operation DATA_READ in the memory device 110 and before the data output operation DATA_OUT in which the read data stored in the page buffer circuit 230 is outputted to the outside of the memory device 110 is performed, the memory controller 120 outputs the pre-resume command PRE-RESUME to the memory device 110.

In the parallel processing step S1660, when receiving the pre-resume command PRE-RESUME, in response to the pre-resume command PRE-RESUME, the memory device 110 may perform the data program operation DATA_PGM of programming data to the memory cell array 210 or the data erase operation DATA_ER of erasing data in the memory cell array 210, and may perform the data output operation DATA_OUT in parallel with the data program operation DATA_PGM or the data erase operation DATA_ER.

Referring to FIG. 16, the method for operating the memory system 100 may further include, before the data read step S1630, cell operation step S1610 in which the memory device 110 performs the data program operation DATA_PGM in response to the program command PGM or the data erase operation DATA_ER in response to the erase command ER, and suspend step S1620 in which the memory device 110 suspends the data program operation DATA_PGM or the data erase operation DATA_ER in response to the suspend command SUSPEND.

In the parallel processing step S1660, the data program operation DATA_PGM or the data erase operation DATA_ER that is performed in parallel with the data output operation DATA_OUT after the memory device 110 receives the pre-resume command PRE-RESUME may be the data program operation DATA_PGM or the data erase operation DATA_ER that is suspended in the suspend step S1620 and is then resumed in the parallel processing step S1660.

Referring to FIG. 16, the method for operating the memory system 100 may further include, after the data read step S1630 and before the pre-resume command step S1650, pre-resume condition determination step S1640 in which it is determined whether the memory device 110 is in a state that satisfies the predefined pre-resume condition, before the memory controller 120 receives the read data stored in the page buffer circuit 230 from the memory device 110.

If it is determined in the pre-resume condition determination step S1640 that the memory device 110 is in a state that satisfies the pre-resume condition, the pre-resume command step S1650 is performed.

In the pre-resume command step S1650, the memory controller 120 may output the pre-resume command PRE-RESUME to the memory device 110, and additionally, may output, to the memory device 110, the data output command D/O which commands the data output operation DATA_OUT.

If it is determined in the pre-resume condition determination step S1640 that the memory device 110 is not in a state that satisfies the pre-resume condition, the pre-resume command step S1650 is not performed. In this case, the memory controller 120 may directly output the data output command D/O to the memory device 110 without outputting the pre-resume command PRE-RESUME so that the data output operation DATA_OUT may be performed in the memory device 110.

Figure 17:
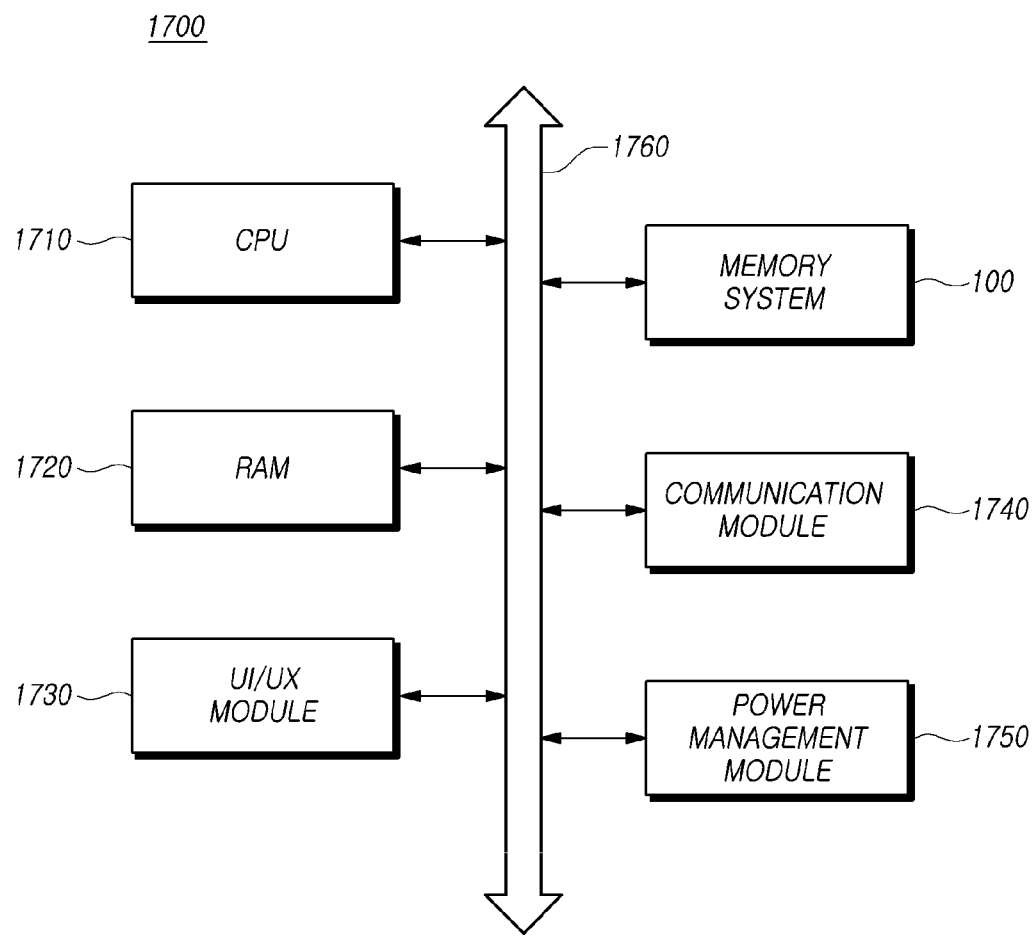
FIG. 17 is a configuration diagram illustrating a computing system in accordance with an embodiment of the disclosure.

FIG. 17 is a configuration diagram illustrating a computing system 1700 in accordance with an embodiment of the disclosure.

Referring to FIG. 17, the computing system 1700 may include a memory system 100, a central processing unit (CPU) 1710 for controlling general operations of the computing system 1700, a RAM 1720 for storing data and information related with operations of the computing system 1700, a UI/UX (user interface/user experience) module 1730 for providing use environment to a user, a communication module 1740 for communicating with an external device in a wired and/or wireless manner, and a power management module 1750 for managing power used by the computing system 1700, which are electrically coupled to a system bus 1760.

The computing system 1700 may include a PC (personal computer), a mobile terminal such as a smartphone and a tablet, or various electronic devices.

The computing system 1700 may further include a battery for supplying an operating voltage, and may further include an application chipset, a graphic-related module, a camera image processor (CIS), a DRAM and so forth. Besides, the computing system 1700 may include other components than the above-described components.

The memory system 100 may include not only a device which stores data in a magnetic disk, such as a hard disk drive (HDD), but also a device which stores data in a nonvolatile memory, such as a solid state drive (SDD), a universal flash storage (UFS) device, and an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM). In addition, the memory system 100 may be realized into various types of storage devices, and may be mounted in various electronic devices.

According to embodiments of the disclosure, it is possible to provide the memory device 110, the memory controller 120, the memory system 100, and the method for operating the memory system 100 capable of improving read quality, program quality, and erase quality in a balanced manner.

Also, according to embodiments of the disclosure, it is possible to provide the memory device 110, the memory controller 120, the memory system 100, and the method for operating the memory system 100 capable of preferentially improving read quality and substantially preventing program quality or erase quality from being degraded due to the improvement in read quality.

Further, according to embodiments of the disclosure, it is possible to provide the memory device 110, the memory controller 120, the memory system 100, and the method for operating the memory system 100 with a relatively fast operation speed by substantially simultaneously processing, in parallel, different kinds of operations that cannot be simultaneously processed in a conventional memory system.

Although embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory system comprising:
a memory device including a memory cell array and a page buffer circuit, the memory device being configured to perform a data program operation or a data erase operation, suspend the data program operation or the data erase operation in response to a suspend command, perform a data read operation of storing read data from the memory cell array in the page buffer circuit in response to a read command, and perform a data output operation of outputting the read data stored in the page buffer circuit; and
a memory controller configured to output a pre-resume command to the memory device between a first time at which the data read operation is complete and a second time at which the data output operation starts.

2. The memory system according to claim 1, wherein, in response to the pre-resume command, the memory device resumes the suspended data program operation or the suspended data erase operation, and performs the data output operation in parallel with the resumed data program operation or the resumed data erase operation.

3. The memory system according to claim 1, wherein:
the memory device outputs a status signal having a first value and a second value that are different from each other and alternate with each other through a status signal output pin;
the status signal has the first value while the data read operation is performed, and transitions from the first value to the second value when the data read operation is complete; and
the memory controller determines an output timing of the pre-resume command based on the status signal, and outputs the pre-resume command to the memory device when the status signal transitions from the first value to the second value.

4. The memory system according to claim 1, wherein:
the page buffer circuit comprises a read buffer and a program buffer, the read buffer storing the read data from the memory cell array, the program buffer storing program data to perform the data program operation; and
after receiving the pre-resume command, while resuming the suspended data program operation of programming the program data stored in the program buffer to the memory cell array, the memory device outputs the read data stored in the read buffer to an outside of the memory device by performing the data output operation.

5. The memory system according to claim 1, wherein:
the memory controller determines whether the memory device is in a state that satisfies a pre-resume condition between the first time and the second time;
the memory controller outputs the pre-resume command to the memory device when the pre-resume condition is satisfied; and the memory controller outputs a data output command to the memory device without outputting the pre-resume command when the pre-resume condition is not satisfied.

6. The memory system according to claim 5, wherein the memory controller determines that the pre-resume condition is satisfied when no read command to be processed exists after outputting the suspend command, or a read count is equal to or greater than a threshold value after outputting the suspend command.

7. The memory system according to claim 5, wherein the memory controller determines that the pre-resume condition is satisfied, when a size of the read data is equal to or larger than a threshold size.

8. The memory system according to claim 5, wherein the memory controller determines that the pre-resume condition is satisfied, when a time interval elapsed after outputting the suspend command is equal to or longer than a predetermined threshold time interval.

9. The memory system according to claim 5, wherein:
when the memory controller outputs the data output command to the memory device without outputting the pre-resume command, the memory controller outputs a resume command to the memory device after receiving the read data from the memory device in response to the data output command; and
the memory device resumes the suspended data program operation or the suspended data erase operation in response to the resume command.

10. A method for operating a memory system including a memory device and a memory controller, the memory device including a memory cell array and a page buffer circuit, the method comprising:
performing a data program operation or a data erase operation;
suspending the data program operation or the data erase operation in response to a suspend command;
performing a data read operation of reading read data from the memory cell array and storing the read data in the page buffer circuit;
performing a data output operation of outputting the read data stored in the page buffer circuit; and
outputting, by the memory controller, a pre-resume command to the memory device between a first time at which the data read operation is complete and a second time at which the data output operation starts.

11. The method according to claim 10, further comprising resuming the suspended data program operation or the suspended data erase operation,
wherein the data output operation is performed in parallel with the resumed data program operation or the resumed data erase operation.

12. The method according to claim 10, further comprising determining whether the memory device is in a state that satisfies a pre-defined pre-resume condition between the first time and the second time,
wherein the memory controller outputs the pre-resume command to the memory device when the pre-resume condition is satisfied, and
wherein the memory controller outputs a data output command to the memory device without outputting the pre-resume command when the pre-resume condition is not satisfied.

13. A memory device comprising:
a memory cell array including a plurality of memory cells;
a control logic configured to perform a data read operation of reading read data from the memory cell array in response to a read command;
a page buffer circuit including a read buffer and a program buffer, and being configured to store the read data from the memory cell array in the read buffer; and
a data input/output circuit configured to output the read data stored in the page buffer circuit to an outside of the memory device,
wherein a data program operation or a data erase operation performed in the memory device is suspended in response to a suspend command,
wherein the control logic resumes the suspended data program operation or the suspended data erase operation in response to a pre-resume command between a first time and a second time, the first time being at which the data read operation is complete, the second time being at which the control logic performs a data output operation of outputting the read data stored in the page buffer circuit to the outside in response to a data output command, the data output command being received after the pre-resume command.

14. The memory device according to claim 13, wherein the control logic, when the data read operation is complete, before or after receiving the pre-resume command, caches the read data stored in the read buffer in a cache, and outputs the read data cached in the cache to the outside in response to the data output command.

15. The memory device according to claim 13, wherein:
the program buffer becomes a deactivated state in response to the suspend command, and transitions from the deactivated state to an activated state in response to the pre-resume command; and
the memory device performs the resumed data program operation and the data output operation in parallel.

16. The memory device according to claim 13, further comprising a status signal output pin configured to output a status signal having a first value and a second value that are different from each other and alternate with each other,
wherein the status signal transitions from the first value to the second value when the data read operation is complete, and the control logic receives the pre-resume command when the status signal transitions from the first value to the second value.

17. A memory device comprising:
a memory cell array including a plurality of memory cells;
a control logic configured to read data from the memory cell array or program data to the memory cell array;
a page buffer circuit including a read buffer that stores the read data and a program buffer that stores the program data; and
a data input/output circuit configured to output the read data stored in the read buffer to an outside of the memory device, and receive the program data to store the program data in the program buffer,
wherein the data input/output circuit outputs the read data stored in the read buffer to the outside for a first period, and
wherein the control logic programs the program data stored in the program buffer to the memory cell array for a second period that overlaps with the first period.

18. A memory controller comprising:
a memory interface configured to communicate with a memory device, the memory device including a memory cell array and a page buffer circuit; and
a control circuit configured to output a suspend command to the memory device to suspend a data program operation or a data erase operation being performed in the memory device, output a read command to the memory device to store read data read from the memory cell array in the page buffer circuit, and output a pre-resume command to the memory device before a data output operation of outputting the read data stored in the page buffer circuit to an outside of the memory device starts.

19. The memory controller according to claim 18, wherein the memory device resumes the suspended data program operation or the suspended data erase operation in response to the pre-resume command, and wherein the control circuit outputs a data output command to the memory device after outputting the pre-resume command to the memory device, and receives the read data from the memory device through the data output operation, the data output operation being performed in parallel with the resumed data program operation or the resumed data erase operation.

20. The memory controller according to claim 19, wherein:

the control circuit determines whether the memory device is in a state that satisfies a pre-defined pre-resume condition, after the read data is stored in the page buffer circuit and before the read data is outputted from the page buffer circuit;

the control circuit outputs the pre-resume command to the memory device when the pre-resume condition is satisfied; and the control circuit outputs the data output command to the memory device without outputting the pre-resume command when the pre-resume condition is not satisfied.

* * * * *